(12) United States Patent
Fukuoka

(10) Patent No.: US 11,594,707 B2
(45) Date of Patent: Feb. 28, 2023

(54) SELF-LUMINOUS DISPLAY PANEL HAVING DIFFERENT DISTANCES BETWEEN OPENINGS OF LIGHT-SHIELDING FILM AND LIGHT-EMITTING ELEMENTS DEPENDING ON LIGHT EMISSION COLOR OF THE LIGHT-EMITTING ELEMENTS

(71) Applicant: JOLED INC., Tokyo (JP)

(72) Inventor: Kenta Fukuoka, Tokyo (JP)

(73) Assignee: JOLED INC., Tokyo (JP)

( * ) Notice: Subject to any disclaimer, the term of this patent is extended or adjusted under 35 U.S.C. 154(b) by 226 days.

(21) Appl. No.: 17/062,643

(22) Filed: Oct. 5, 2020

(65) Prior Publication Data

US 2021/0104708 A1 Apr. 8, 2021

(30) Foreign Application Priority Data

Oct. 7, 2019 (JP) .............................. JP2019-184788

(51) Int. Cl.
*H01L 51/52* (2006.01)
*H01L 27/32* (2006.01)
*H01L 51/56* (2006.01)

(52) U.S. Cl.
CPC ...... *H01L 51/5284* (2013.01); *H01L 27/3216* (2013.01); *H01L 27/3246* (2013.01); *H01L 51/56* (2013.01); *H01L 27/322* (2013.01); *H01L 51/5265* (2013.01); *H01L 2251/5315* (2013.01)

(58) Field of Classification Search
CPC combination set(s) only.
See application file for complete search history.

(56) References Cited

U.S. PATENT DOCUMENTS

| 5,443,922 | A | 8/1995 | Nishizaki et al. |
| 9,401,477 | B2* | 7/2016 | Matsushima ....... H01L 27/3218 |
| 2008/0224963 | A1 | 9/2008 | Takagi et al. |
| 2010/0213438 | A1 | 8/2010 | Cho et al. |
| 2011/0043096 | A1 | 2/2011 | Asaki |
| 2012/0243221 | A1* | 9/2012 | Takagi ................ H01L 27/3246 |
| | | | 362/231 |

(Continued)

FOREIGN PATENT DOCUMENTS

| JP | 05-163488 A | 6/1993 |
| JP | 2000-098126 A | 4/2000 |

(Continued)

*Primary Examiner* — Nduka E Ojeh
(74) *Attorney, Agent, or Firm* — Xsensus LLP

(57) ABSTRACT

A self-luminous display panel including light-emitting elements 100, column banks 122Y, and a light-shielding film 133. The light-emitting elements 100 correspond one-to-one with sub-pixels 100*se*, each sub-pixel 100*se* in a pixel emitting a different color of light. The column banks 122Y are disposed between the light-emitting elements 100 in a row direction, each having an elongated shape in a column direction. The light-shielding film 133 has openings 133*a* at positions corresponding to the light-emitting elements 100 in plan view, downstream in a light emission direction of the light-emitting elements 100. In plan view, distances in the row direction between edges of the openings 133*a* of the light-shielding film 133 and defined points of the light-emitting elements 100 are different depending on light emission color of the light-emitting elements 100, due to different widths of portions of the column banks 122Y adjacent to the light-emitting elements 100.

8 Claims, 19 Drawing Sheets

(56) References Cited

U.S. PATENT DOCUMENTS

| | | | |
|---|---|---|---|
| 2018/0151840 A1 | 5/2018 | Fukuda | |
| 2020/0212113 A1* | 7/2020 | Song | H01L 33/50 |
| 2020/0227489 A1* | 7/2020 | Kim | H01L 51/5275 |
| 2020/0266394 A1* | 8/2020 | Kishimoto | H01L 51/0007 |

FOREIGN PATENT DOCUMENTS

| | | |
|---|---|---|
| JP | 2008-226747 A | 9/2008 |
| JP | 2010-199067 A | 9/2010 |
| JP | 2011-040352 A | 2/2011 |
| JP | 2018-088365 A | 6/2018 |

* cited by examiner

FIG. 5A
FIG. 5B
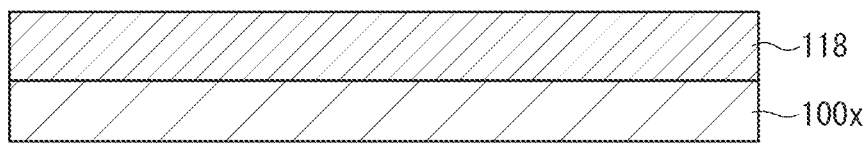
FIG. 5C
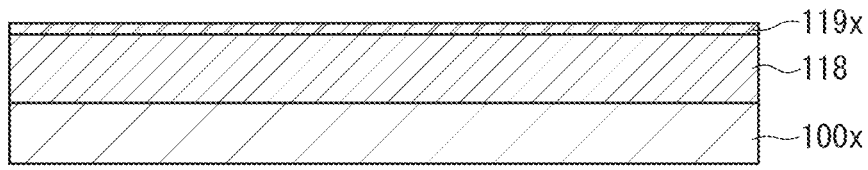
FIG. 5D
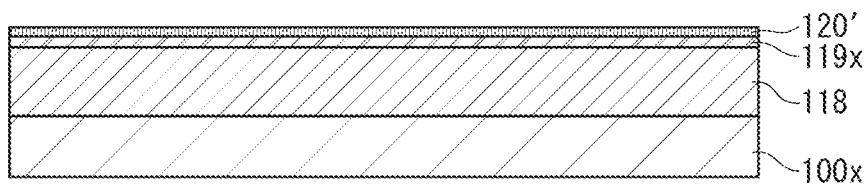
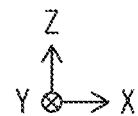

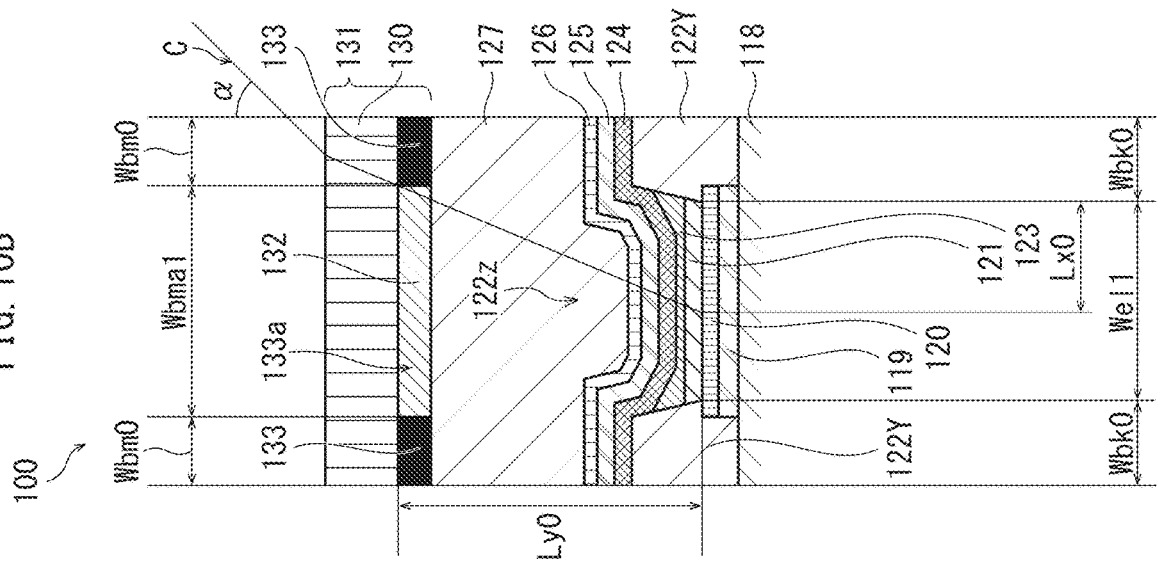
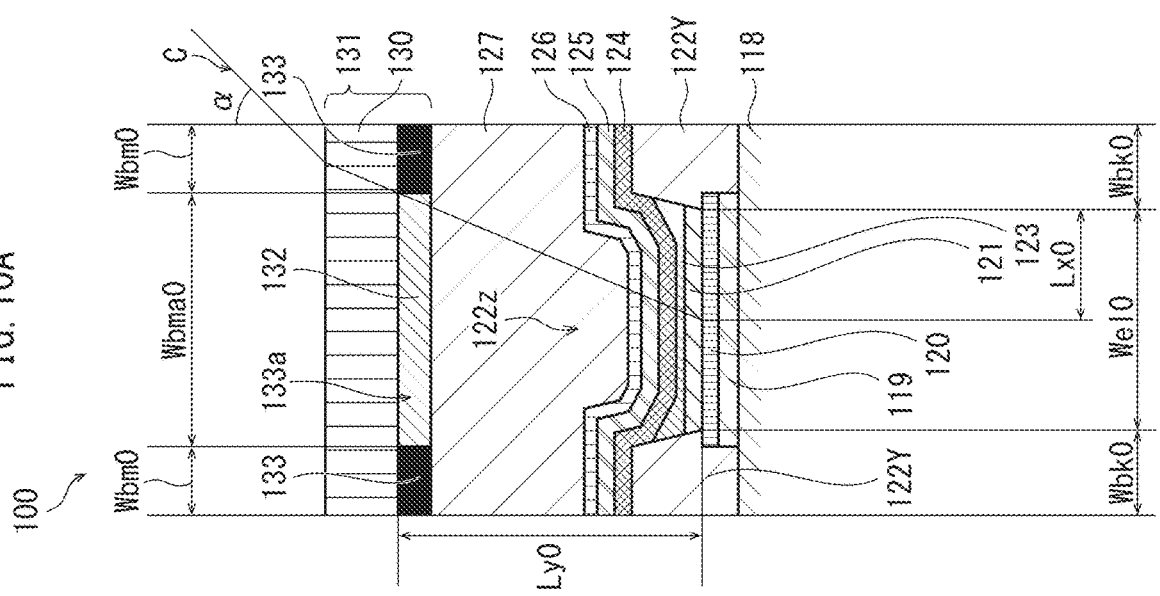

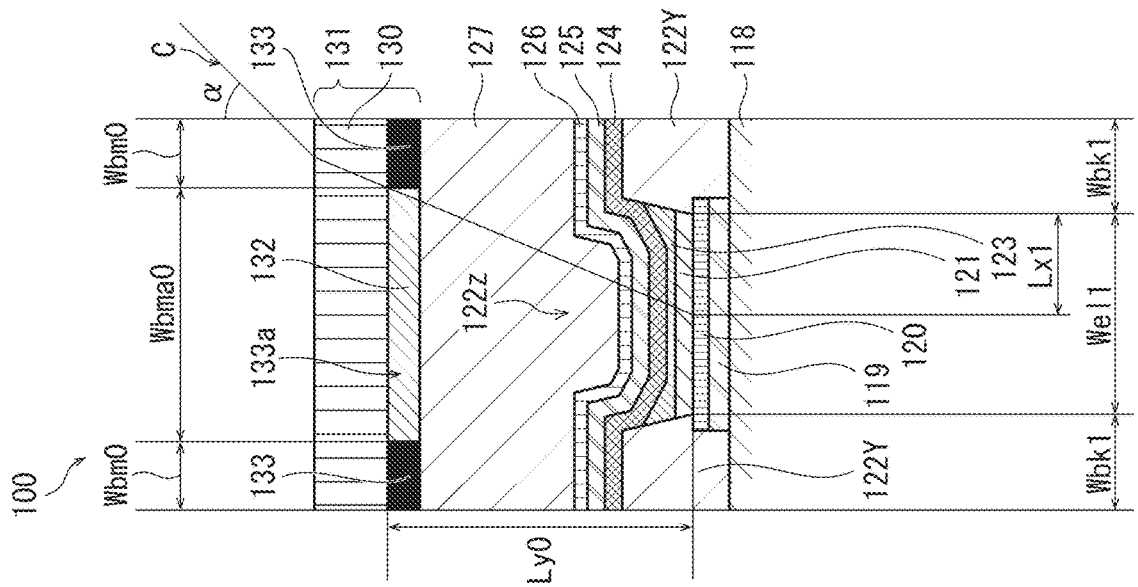
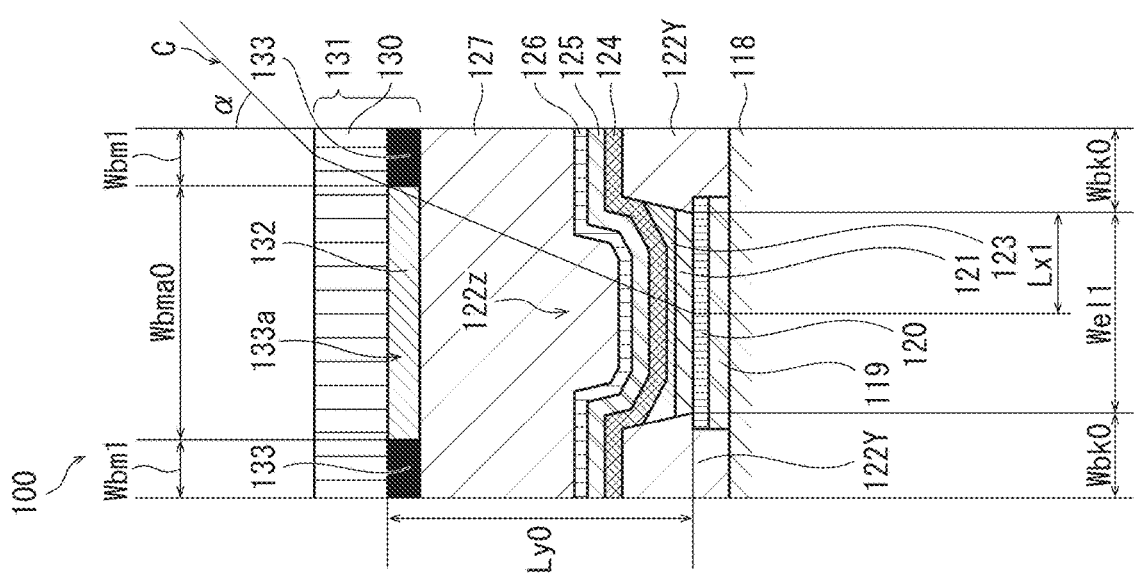

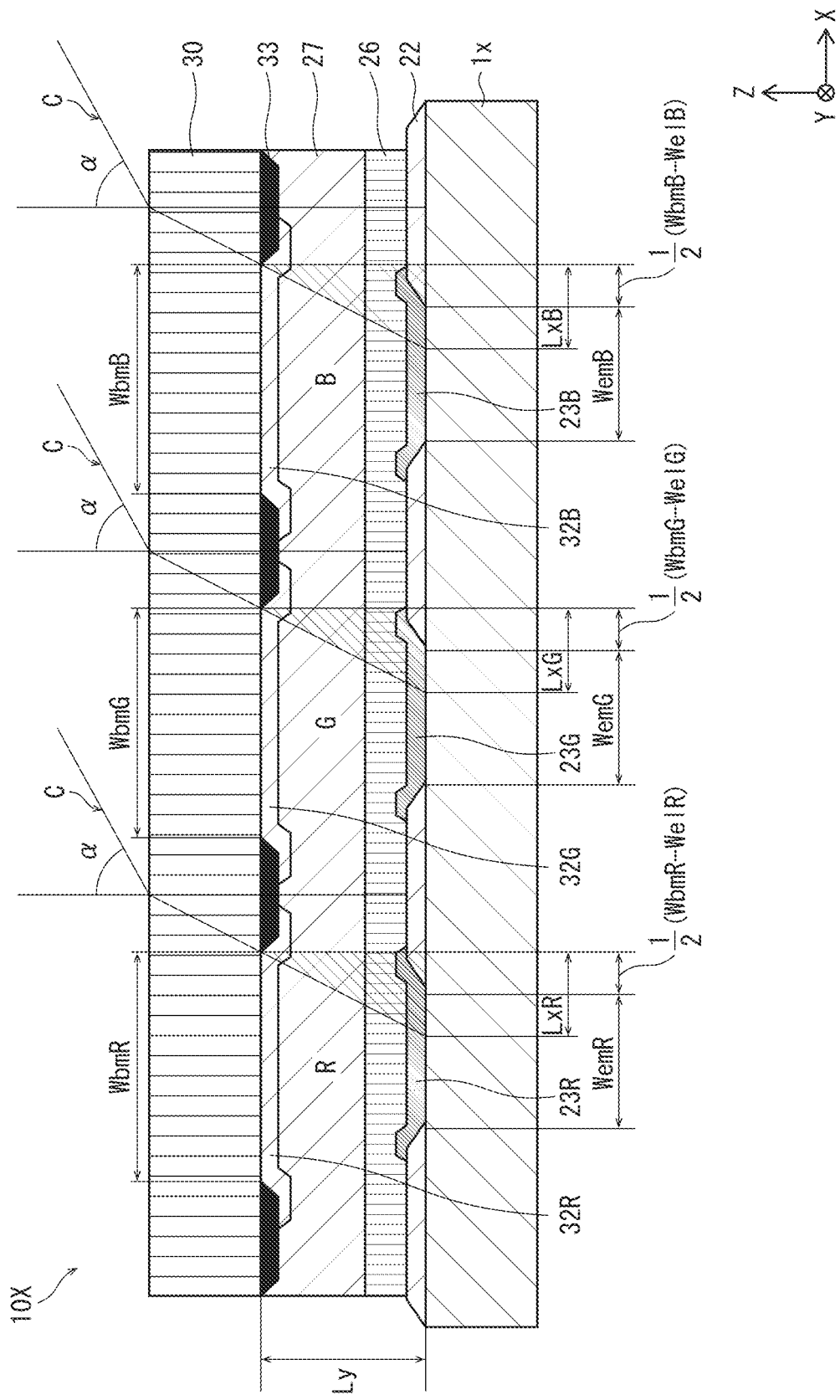

SELF-LUMINOUS DISPLAY PANEL HAVING DIFFERENT DISTANCES BETWEEN OPENINGS OF LIGHT-SHIELDING FILM AND LIGHT-EMITTING ELEMENTS DEPENDING ON LIGHT EMISSION COLOR OF THE LIGHT-EMITTING ELEMENTS

This application claims priority to Japanese Patent Application No. 2019-184788 filed Oct. 7, 2019, the contents of which are hereby incorporated by reference in their entirety.

BACKGROUND

Technical Field

The present disclosure relates to display panels in which pixels including a light-emitting element such as an organic electroluminescence element (also referred to as an organic EL element) are arranged in two dimensions across a main surface of a substrate, and methods for manufacturing such display panels.

Description of the Related Art

In recent years, organic EL display panels in which organic EL elements are arranged in a matrix on a substrate have been implemented as display panels used in display devices such as digital televisions. An organic EL element has a basic structure in which a light-emitting layer including organic light-emitting material is sandwiched between a pair of electrodes. When driven, a voltage is applied between the pair of electrodes, causing recombination of holes and electrons injected into the light emitting layer and light emission.

A top-emission type of organic EL element has a structure in which a substrate, a pixel electrode made of a light-reflecting material (reflective electrode), an organic layer (including a light-emitting layer), and a counter electrode made of a light-transmissive material are arranged in this order. By adopting an optical resonator structure in which constructive interference between light from the light-emitting layer reflected by the reflective electrode and emitted from the counter electrode and light emitted directly from the light-emitting layer, high light extraction efficiency can be realized.

In an organic EL display panel for a color display, such an organic EL element forms a red (R), green (G), or blue (B) color sub-pixel, and adjacent RGB sub-pixels combine to form a pixel in the color display. Typically, in an organic EL display panel, as described in JP 2008-226747, for example, a grid-shaped light-shielding film is provided at boundaries between adjacent sub-pixels, and a color filter layer corresponding to each of the RGB colors is provided above the sub-pixels that are surrounded in plan view by the light-shielding layer. This prevents a reduction in display contrast caused by reflection of external light on outer edges of reflective electrodes of sub-pixels and prevents mixing of colors between adjacent pixels.

Further, for example, JP 2011-40352 describes a technique for reducing chromaticity changes when viewed from an oblique angle, by making sizes of banks that partition RGB colors of sub-pixels and sizes of a grid-shaped light-shielding film different for each color of sub-pixel.

SUMMARY

A self-luminous display panel pertaining to an aspect of the present disclosure is a self-luminous display panel in which pixels composed of sub-pixels are arranged in a matrix of rows and columns, including light-emitting elements, column banks, and a light-shielding film. The light-emitting elements correspond one-to-one with the sub-pixels, each sub-pixel in a pixel emitting a different color of light. The column banks are disposed between the light-emitting elements in a row direction, each of the column banks having an elongated shape in a column direction. The light-shielding film is provided with openings at positions corresponding to the light-emitting elements in plan view, downstream in a light emission direction of the light-emitting elements. In plan view, distances in the row direction between edges of the openings of the light-shielding film and defined points of the light-emitting elements are different depending on light emission color of the light-emitting elements, due to different widths of portions of the column banks adjacent to the light-emitting elements.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIGS. 5A, 5B, 5C, and 5D are schematic diagrams of cross-sections taken from the same location as A1-A1 in FIG. 1, illustrating states in manufacturing of the organic EL display panel 10, according to at least one embodiment.

FIGS. 10A and 10B are enlarged schematic diagrams of cross-sections of light-emitting elements of reference examples in which widths of openings 133a of a light-shielding film 133 are different.

FIGS. 11A and 11B are enlarged schematic diagrams of cross-sections of light-emitting elements of reference examples in which widths of openings 133a of a light-shielding film 133 are different.

FIG. 19 is a schematic diagram of a cross-section taken along a row direction of a pixel of an organic EL display panel.

DETAILED DESCRIPTION

Figure 1:
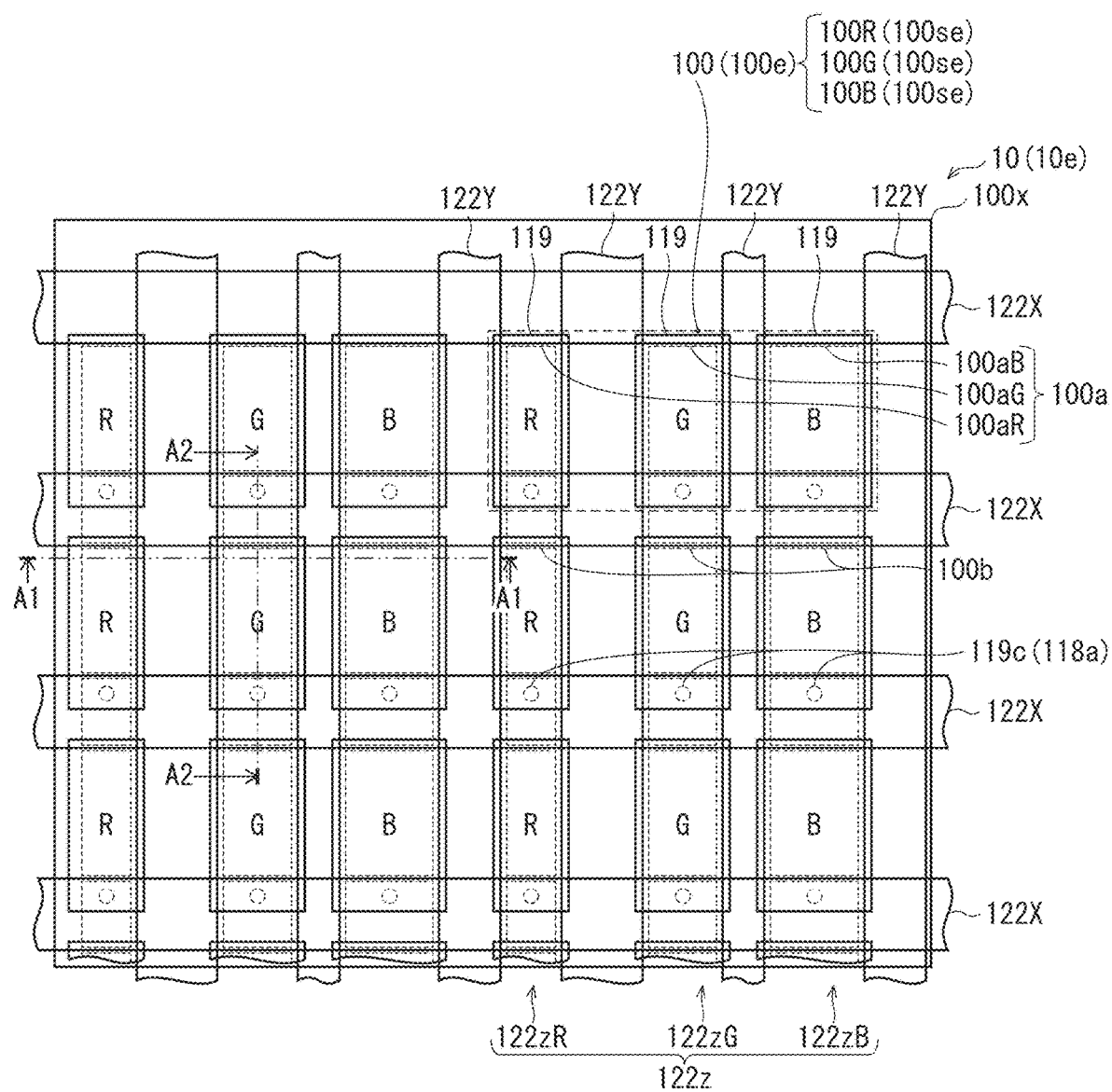
FIG. 1 is a schematic plan view diagram enlargement of a portion of an organic EL display panel 10 according to at least one embodiment.

There are technical problems with the structure described in JP 2008-226747, in that when the organic EL display panel is viewed from an oblique direction, the shielding of part of a self-luminous area of each sub-pixel by the grid-shaped light-shielding film causes a change in chromaticity of a displayed image, and in a high definition organic EL display panel, it is difficult to sufficiently reduce such a change in chromaticity.

FIG. 19 is a schematic diagram of a cross-section taken in a row direction (X direction in FIG. 19) of a pixel of an organic EL display panel 10X. In the organic EL display panel 10X, one pixel includes light-emitting elements 23R, 23G, 23B arranged side by side in the row direction that emit RGB colors of light and are partitioned from each other by banks 22 that extend in a column direction (Y direction in FIG. 19) on a surface of a substrate 1*x*. The light-emitting elements 23R, 23G, 23B and the banks 22 are covered with a sealing layer 26 made of an inorganic material, and the substrate 1*x* is joined to an upper substrate 30 via a joining layer 27 made of a resin material. The substrate 1*x* is separated from the upper substrate 30 by a distance Ly. The upper substrate 30 is provided with a light-shielding film 33 containing a black pigment that has openings corresponding to the light-emitting elements 23R, 23G, 23B. Likewise, color filter layers 32R, 32G, 32B in the openings correspond to the light-emitting elements 23R, 23G, 23B.

In the display panel 10X, when a width of light-emitting elements is Wel (WelR, WelG, WelB), a width of openings of the light-shielding film 133 is Wbm (WbmR, WbmG, WbmB), and a distance between a light emission reference point and the light-shielding film 133 is Ly, the widths WbmR, WbmG, WbmB of the openings of the light-shielding film 133 are greater than the corresponding widths WelR, WelG, WelB of the light-emitting elements 23R, 23G, 23B. Light is emitted upwards (Z direction in FIG. 19) from the light-emitting elements 23.

When the display panel 10X is viewed from a direction of line of sight C with a viewing angle α, a light-shielding width is Lx (LxR, LxG, LxB), and therefore a light-shielding ratio with respect to the light-emitting element width Wel is Lx/Wel. Thus, a rate of reduction of luminance from the light-emitting element 23 visually recognized by a viewer increases as the light-shielding ratio increases. When the rate of reduction of luminance is different among the light-emitting elements 23R, 23G, 23B, luminance balance from light-emitting elements 100R, 100G, 100B changes, and therefore chromaticity visually recognized by a viewer changes. When viewed from an oblique angle, this appears as a chromaticity shift in grays and midtones.

In response to this problem, JP 2011-40352, for example, proposes a technique of intentionally making light-shielding ratios of the light-emitting elements 23R, 23G, 23B different, by making gaps between the banks 22 partitioning the light-emitting elements 100 different and making sizes of openings of the grid-shaped light-shielding film 33 different, in order to compensate for and reduce visually recognized chromaticity changes from an oblique viewing angle. However, in a study by the inventor, it was found that in a high definition organic EL display panel, there is a problem with the method described in JP-2011-40352 in that it is difficult to sufficiently reduce changes in chromaticity visually recognized when viewed from an oblique viewing angle, due to the increase in pixel density and decrease in area of each light-emitting element 23.

For example, when an opening area of the grid-shaped light-shielding film 33 is reduced relative to the banks 22, it may be difficult to align the light-shielding film 33 on the upper substrate 30 to the light-emitting elements 100 when joining the upper substrate 30 to the substrate 1*x*. Further, when an opening area of the grid-shaped light-shielding film 33 is increased relative to the banks 22, an increase in opening width Wbm is limited by a minimum line width of the light-shielding film 33, and it may not be possible to sufficiently reduce the light-shielding ratio.

Further, light-shielding ratios of the light-emitting elements 23R, 23G, 23B at the viewing angle α are different due to structural differences, and this may cause changes in chromaticity visually recognized by a viewer.

The present disclosure is made in view of the problems described above, and an object of the present disclosure is to provide a self-luminous display panel capable of high definition and a reduction in change of chromaticity of emitted light when a display image is viewed from an oblique viewing angle.

In order to solve the technical problems, the inventor extensively studied structures of self-luminous display panels capable of high definition and reduced chromaticity changes of emitted light when a display image is viewed from a viewing angle 45° or more from the front, and arrived at the self-luminous display panel pertaining to at least one embodiment of the present disclosure.

The self-luminous display panel pertaining to at least one embodiment of the present disclosure is capable of high definition and reduced chromaticity changes of emitted light when a display image is viewed from an oblique viewing angle.

Such technical problems are not limited to organic EL display panels that use organic EL elements as light-emitting elements. Similar technical problems occur in any display panel that includes self-luminous light-emitting elements in which a wet process is used to form an organic functional layer to construct an optical resonator structure, such as inorganic EL display panels in which light-emitting layers are made of inorganic materials, quantum dot display panels in which light-emitting layers are made of quantum dot light-emitting elements (quantum dot light-emitting diodes (QLED)), and the like.

Overview of Embodiments of Present Disclosure

A self-luminous display panel pertaining to an embodiment of the present disclosure is a self-luminous display panel in which pixels composed of sub-pixels are arranged in a matrix of rows and columns, including light-emitting elements, column banks, and a light-shielding film. The light-emitting elements correspond one-to-one with the sub-pixels, each sub-pixel in a pixel emitting a different color of light. The column banks are disposed between the light-emitting elements in a row direction, each of the column banks having an elongated shape in a column direction. The light-shielding film is provided with openings at positions corresponding to the light-emitting elements in plan view, downstream in a light emission direction of the light-emitting elements. In plan view, distances in the row direction between edges of the openings of the light-shielding film and defined points of the light-emitting elements are different depending on light emission color of the light-emitting elements, due to different widths of portions of the column banks adjacent to the light-emitting elements.

According to this structure, the self-luminous display panel can be implemented that is capable of high definition and reduced chromaticity changes of emitted light when a display image is viewed from an oblique viewing angle.

According to at least one embodiment, the light-emitting elements have different widths in the row direction depending on the light emission color of the light-emitting element, and among the light-emitting elements of each pixel, a first light-emitting element that has a larger width has smaller values for the distances in the row direction between the edges of the corresponding opening and the defined points of the light-emitting element than a second light-emitting element that has a smaller width.

According to this structure, when light-emitting elements that constitute structure of a pixel have different widths, among the light-emitting elements of the pixel, a second light-emitting element that has a smaller width corresponds to larger widths in the row direction of portions of the column banks adjacent to the light-emitting element than a first light-emitting element that has a larger width, and therefore light-emitting element width and light-shielding are simultaneously reduced. As a result, in a high definition organic EL display panel, even when pixel density is increased and unit areas of the light-emitting elements are decreased, a self-luminous display panel structure can be realized that reduces changes in chromaticity of emitted light when a display image is viewed from an oblique angle.

According to at least one embodiment, among crosspieces of the light-shielding film between the openings, among the crosspieces corresponding to each pixel, a first crosspiece that has a smaller width in the row direction corresponds to a column bank that has a larger width in the row direction while a second crosspiece that has a larger width in the row direction corresponds to a column bank that has a smaller width in the row direction.

According to this structure, when light-emitting elements that constitute structure of a pixel have different widths, among the light-emitting elements of the pixel, a second light-emitting element that has a smaller width corresponds to larger widths in the row direction of portions of the column banks adjacent to the light-emitting element and smaller widths in the row direction of a crosspiece portion of the light-shielding film than a first light-emitting element that has a larger width. This means light-emitting element width and light-shielding ratio are simultaneously reduced, and even more effectively reduces light-shielding ratio.

According to at least one embodiment, the light-emitting elements have different light emission distributions in the row direction depending on the light emission color of the light-emitting element, and among the light-emitting elements of each pixel, a first light-emitting element that has a light emission distribution shape that has a larger half maximum luminance range has larger values for the distances in the row direction between the edges of the corresponding opening and the defined points of the light-emitting element than a second light-emitting element that has a light emission distribution shape that has a smaller half maximum luminance range.

According to this structure, a change in visually recognized chromaticity when viewed from an oblique direction is reduced, where the change is due to differences in luminance of each color of light-emitting element causing differences in visually recognized luminance distribution among the light-emitting elements that have the same apparent light-shielding ratio when viewed from the oblique direction.

According to at least one embodiment, widths in the row direction of crosspieces of the light-shielding film between the openings are constant, regardless of light emission color of the light-emitting elements.

According to this structure, luminance is increased when viewed from the viewing angle α due to a reduction in light-shielding ratio, while securing a minimum line width of the light-shielding film in a crosspiece manufacturing process.

According to at least one embodiment, the light-emitting elements of each pixel are arranged in a line in the row direction, each of the light-emitting elements includes a light-emitting layer including an applied film disposed in a gap between the column banks, and each of the light-emitting layers includes a flat portion that has a substantially uniform film thickness disposed in a range that includes a center point in the row direction of the gap between the column banks, and pinning portions disposed on either side of the flat portion in the row direction that have a larger film thickness than the flat portion.

According to this structure, light-shielding ratios when viewed from an oblique viewing angle are such that the light-shielding ratio in the row direction is greater than the light-shielding ratio in the column direction, and a chromaticity change visually recognized from the oblique viewing angle also changes more in the row direction than in the column direction. Thus, a structure of a display panel can be implemented that effectively reduces changes in chromaticity visually recognized from an oblique direction by changing widths in the row direction of portions of the column banks adjacent to light-emitting elements and thereby distances in the row direction between edges of openings of the light-shielding film and defined points of the light-emitting elements.

According to at least one embodiment, a difference in chromaticity between chromaticity observed from a viewing angle of 45° from the front of the display panel in the row direction and chromaticity observed from a viewing angle of 45° from the front of the display panel in the column direction is from 0 to 0.020, where the difference in observed chromaticity is caused by a portion of light emitted from each light-emitting element being shielded by the edge of the opening of the light-shielding film.

According to this structure, it is possible to reduce a change in chromaticity visually recognized from an oblique viewing angle when opening widths in the row direction and the column direction of each of the openings of the light-shielding film are decreased, causing light-shielding ratios to increase.

According to at least one embodiment, luminance observed from a viewing angle of 45° from the front of the display panel in the column direction is 103% or more of luminance observed from a viewing angle of 45° from the front of the display panel in the row direction, where a difference in observed luminance is caused by a portion of light emitted from each light-emitting element being shielded by the edge of the opening of the light-shielding film.

According to this structure, a structure of a display panel can be implemented that more accurately compensates for changes in chromaticity visually recognized when viewed from an oblique angle due to different light-shielding ratios among light-emitting elements when the light-emitting layers of the light-emitting elements are applied films elongated and continuous in the column direction in gaps between column banks.

<Overall Structure of Organic EL Display Panel 10>

The following describes an organic EL display panel 10 (also referred to as "display panel 10") pertaining to the present embodiment, with reference to the drawings. Note that the drawings are schematic diagrams and are not necessarily to scale. FIG. 1 is a plan view diagram of the display panel 10 according to at least one embodiment.

The display panel 10 has a top-emission structure in which light is emitted from a top surface thereof, and in which organic EL elements 100, which constitute pixels, are arranged on a substrate 100x (TFT substrate) including thin film transistors (TFTs). Here, in the present description, the X direction, Y direction, and Z direction in the drawings represent a row direction, column direction, and thickness direction of the display panel 10, respectively.

As illustrated in FIG. 1, the display panel 10 includes light-emitting elements 100R, 100G, and 100B arranged in a matrix on the substrate 100x (also referred to as "light-emitting elements 100"), defined by column banks 122Y and row banks 122X (also referred to as "banks 122") arranged in a partitioned area 10e (also referred to as "area 10e"). The light-emitting elements 100R, 100G, 100B includes corresponding self-luminous areas 100aR, 100aG, 100aB that emit a corresponding color of light (red, green, or blue) (also referred to as "self-luminous areas 100a"). Each of the light-emitting elements 100 correspond to a sub-pixel 100se, which is a light-emitting unit. A unit pixel 100e includes three of the sub-pixels 100se arranged in a row. In the area 10e of the display panel 10, the unit pixels 100e are arranged in a matrix of rows and columns.

Further, as illustrated in FIG. 1, in the display panel 10, pixel electrodes 119 are arranged in a matrix of rows and columns on the substrate 100x, separated from each other by defined distances in the row and column directions. Each of the pixel electrodes 119 has a rectangular shape in plan view and is made of a light-reflective material. The pixel electrodes 119 are arranged so that three of the pixel electrodes 119 in a row along the row direction correspond to three of the self-luminous areas 100a: 100aR, 100aG, and 100aB. Lengths 119x in the row direction of the pixel electrodes 119 are configured such that the length 119x of the pixel electrodes 119 corresponding to the light-emitting elements 100B is longest, the length 119x of the pixel electrodes 119 corresponding to the light-emitting elements 100R is shortest, and the length 119x of the pixel electrodes 119 corresponding to the light-emitting elements 100G is between these two values. Areas of the self-luminous areas 100aB, 100aG, 100aR have the same relationship of relative sizes. Accordingly, the widths WelB, WelG, WelR in the row direction of the light-emitting elements 100B, 100G, 100R have the same relationship of relative sizes, such that the width WelB is largest and the width WelR is the smallest.

In the display panel 10, the banks 122 have a line-shaped bank structure. Between every two adjacent pixel electrodes 119 in the row direction is a column bank 122Y that extends in the column direction (Y direction in FIG. 1).

Similarly, between every two adjacent pixel electrodes 119 in the column direction is a row bank 122X that extends in the row direction (X direction in FIG. 1). Areas in which the row banks 122X are present are areas in which organic electroluminescence does not occur in the light-emitting layers 123, and are therefore referred to as non-self-luminous areas 100b.

Gaps between the column banks 122Y corresponding to the self-luminous areas 100aR are referred to as red gaps 122zR, gaps corresponding to the self-luminous areas 100aG are referred to as green gaps 122z G, and gaps corresponding to the self-luminous areas 100aB are referred to as blue gaps 122zB (gaps between the column banks 122Y may also be referred to as "gaps 122z").

Further, as illustrated in FIG. 1, in the display panel 10, the self-luminous areas 100a and the non-self-luminous areas 100b are arranged to alternate in the column direction alongside the gaps 122z. Contact recesses 119c (in contact holes 118a) are provided in the non-self-luminous areas 100b to connect the pixel electrodes 119 to TFT sources $S_1$.

<Components of Display Panel 10>

Figure 2:
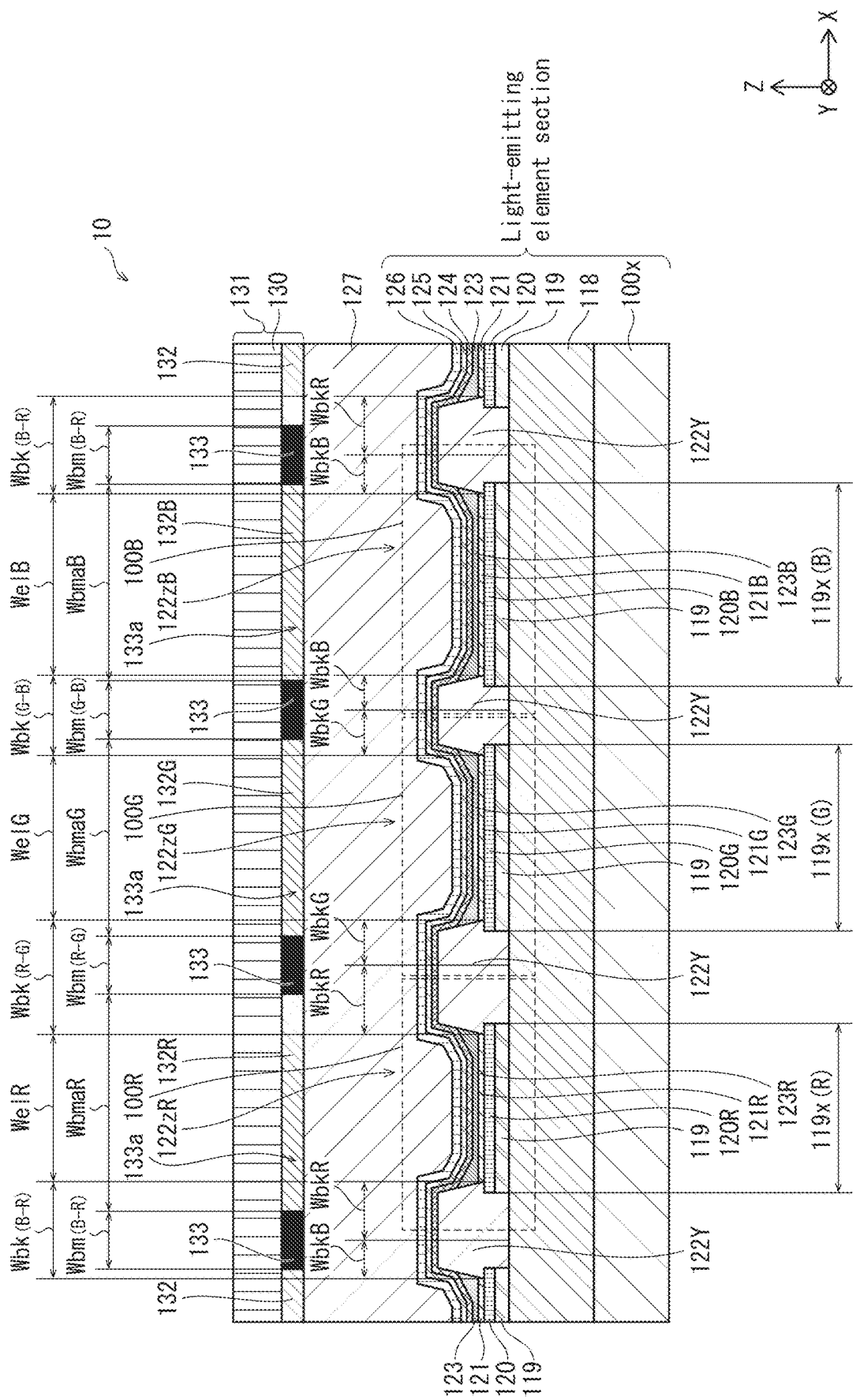
FIG. 2 is a schematic diagram of a cross-section taken along a line A1-A1 in FIG. 1, according to at least one embodiment.
Figure 3:
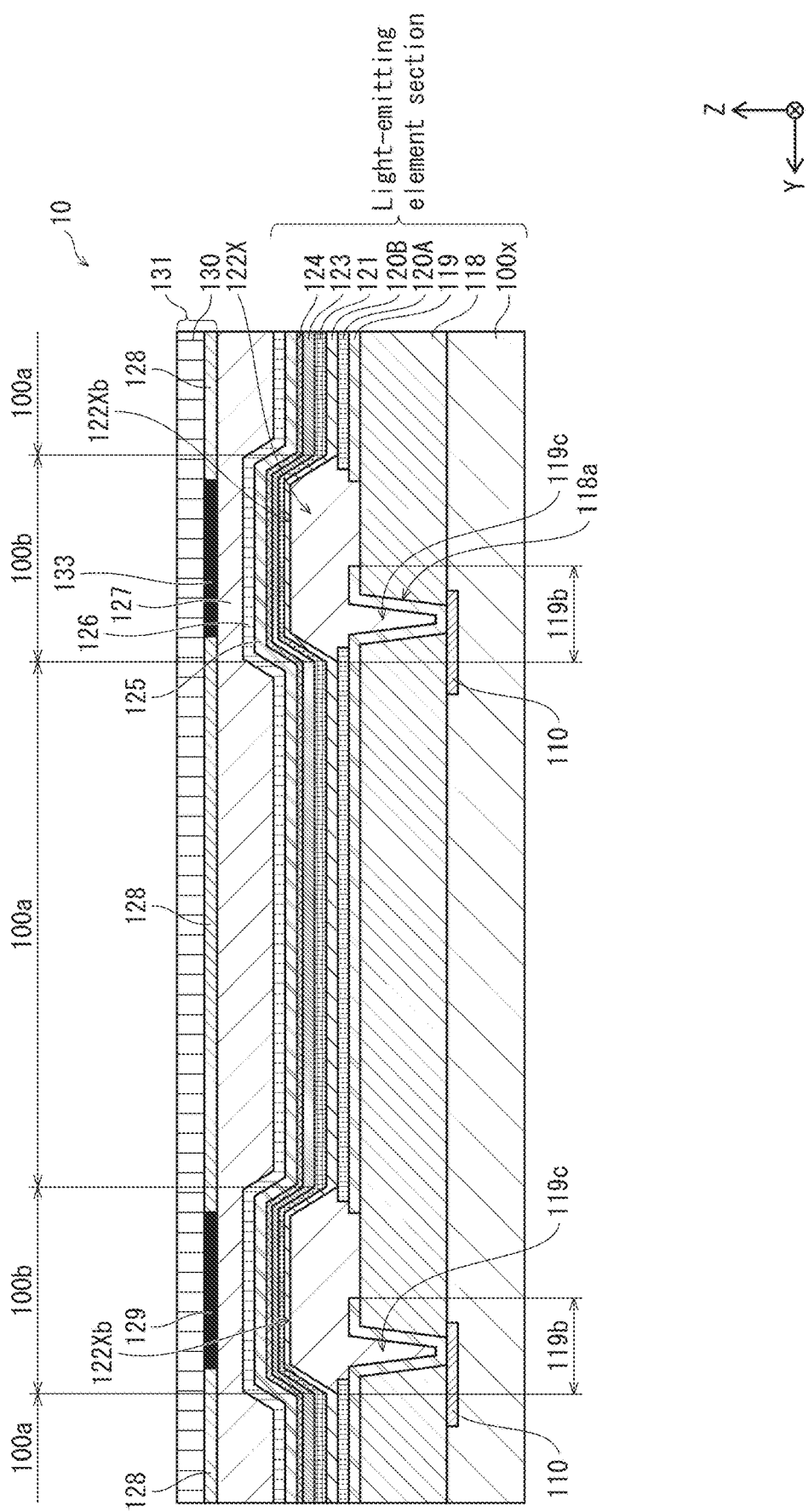
FIG. 3 is a schematic diagram of a cross-section taken along a line A2-A2 in FIG. 1, according to at least one embodiment.

The following describes structure of the organic EL elements 100 in the display panel 10, with reference to FIG. 2 and FIG. 3. FIG. 2 and FIG. 3 are schematic diagrams of cross-sections taken along lines A1-A1 and A2-A2 in FIG. 1.

In the display panel 10 pertaining to the present embodiment, a substrate on which thin film transistors are formed (a TFT substrate) is formed as a substrate in the Z axis direction, and an organic EL element section is formed thereon.

(Light-Emitting Element Section)

[Substrate 100x]

The substrate 100x is a support member of the display panel 10 and includes a base (not illustrated) and a thin film transistor layer (not illustrated) on the base.

The base is a support member of the display panel 10, and is a flat plate. As a material of the base, an electrically insulating material such as a glass material, a resin material, a semiconductor material, a metal material coated with an insulating layer, or the like can be used.

TFT circuitry electrically connects the pixel electrodes 119 to an external power source according to a drive signal from a circuit external to the light-emitting elements 100. The TFT layer is a multi-layer structure including an electrode, a semiconductor layer, an insulating layer, and the like formed on a top surface of the base. According to the present embodiment, the TFT layer includes multiple TFTs and wiring formed on the top surface of the base. The wiring electrically connects the pixel electrodes 119 corresponding to the TFT sources $S_1$, an external power source, an external circuit, and the like.

[Planarizing Layer 118]

The planarizing layer 118 is disposed on a top surface of the base and TFT layer. The planarizing layer 118 disposed on the top surface of the substrate 100x planarizes the top surface of the substrate 100x that is uneven due to the TFT layer, filling spaces between the wiring and the TFTs, and electrically insulating between the wiring and the TFTs.

In order to connect the pixel electrodes 119 to the wiring connected to the TFT sources $S_1$, the contact holes 118a corresponding to the pixel electrodes 119 are formed in the planarizing layer 118 above part of the wiring.

[Pixel Electrodes 119]

As illustrated in FIG. 2 and FIG. 3, the pixel electrodes 119 correspond one-to-one with the sub-pixels 100se and are disposed on the planarizing layer 118 in the area 10e of the substrate 100x.

The pixel electrodes 119 supply carriers to the light emitting layers 123. For example, if functioning as anodes, the pixel electrodes 119 supply holes to the light emitting layers 123. The display panel 10 is a top-emission type of display panel, and the pixel electrodes 119 are light-reflective. The pixel electrodes 119 each have, for example, a substantially rectangular flat plate shape in plan view. According to the present embodiment, as described above, the lengths 119x(B), (G), (R) in the row direction of the pixel electrodes 119 of the light-emitting elements 100B, 100G, 100R are configured from longest (B) to shortest (R). Thus, current density of the light-emitting layers 123 goes from least to most in the order of light-emitting elements 100B, 100G, 100R, compensating for differences in element life of the light-emitting elements 100 of each color.

The connecting recesses 119c of the pixel electrodes 119 are formed by recessing portions of the pixel electrodes 119 in the direction of the substrate 100x in the contact holes of the planarizing layer 118. Bottoms of the connecting recesses 119c connect to wiring connected to TFT sources $S_1$ corresponding to the pixel electrodes 119.

[Hole Injection Layers 120]

Hole injection layers 120 are laminated on the pixel electrodes 119 as illustrated in FIG. 2 and FIG. 3. The hole injection layers 120 have a function of transporting holes injected from the pixel electrode layers 119 to hole transport layers 121.

The hole injection layers 120 each include a lower layer made of a metal oxide formed on the pixel electrodes 119 and an upper layer made of an organic material laminated on the lower layer in the gaps 122zR, 122zG, 122zB. The upper layers formed in the RGB sub-pixels have different film thicknesses depending on RGB sub-pixel color.

According to the present embodiment, as illustrated in FIG. 3, the hole injection layers 120 extend linearly in the column direction in the gaps 122zR, 122zG, 122zB.

[Banks 122]

As illustrated in FIG. 2, banks made of an insulating material cover edges of the pixel electrodes 119 and the hole injection layers 120. The banks include the column banks 122Y that extend in the column direction and are arranged side-by-side in the row direction and the row banks 122X that extend in the row direction and are arranged side-by-side in the column direction.

The column banks 122Y each have a line-like shape extending in the column direction, and in a cross-section taken parallel to the row direction the column banks 122Y each have a tapered trapezoid shape that tapers upwards. The column banks 122Y define outer edges in the row direction of the light-emitting layers 123 formed as ink containing organic compounds that are materials of the light-emitting layers 123 is blocked by the column banks 122Y from flowing in the row direction. Further, base portions in the row direction of the column banks 122Y define edges of the self-luminous areas 100a of the sub-pixels 100se in the row direction.

Here, as illustrated in FIG. 2, in plan view, distances in the row direction between edges of openings 133a of the light-shielding film 133 and edges of the light-emitting elements 100 are made different by varying widths of the column banks 122Y in the row direction, and therefore structure varies depending on light emission color of the light-emitting elements 100.

In other words, the widths of portions of the column banks 122Y on either side in the row direction vary depending on light emission color of adjacent light-emitting elements 100, so that distances in the row direction between edges of the openings 133a of the light-shielding films 133 and outer edges of the light-emitting elements 100 are different.

More specifically, of two of the column banks 122Y either side of one of the light-emitting elements 100R, a width Wbk(B-R) of the column bank 122Y disposed between the light-emitting element 100R and an adjacent one of the light-emitting elements 100B is composed of a width WbkB of a portion adjacent to the light-emitting element 100B and a width WbkR of a portion adjacent to the light-emitting element 100R, while a width Wbk(R-G) of the column bank 122Y disposed between the light-emitting element 100R and an adjacent one of the light-emitting elements 100G is composed of a width WbkR of a portion adjacent to the light-emitting element 100R and a width WbkG of a portion adjacent to the light-emitting element 100G. The width WbkR of the portion adjacent to the light-emitting element 100R is defined according to the light emission color of the light-emitting element 100R.

Taking the width Wbk(B-R) of the column bank 122Y as an example, the width WbkB and the width WbkR may be set by dividing the width Wbk(B-R) internally according to a ratio of the width WelR of the adjacent light-emitting element 100R and the width WelB of the adjacent light-emitting element 100B. Alternatively, the width Wbk(B-R) of the column bank 122Y may be divided equally.

Similarly, for the width Wbk(R-G) of the column bank 122Y, the width WbkR and the width WbkG may be set by dividing the width Wbk(R-G) internally according to a ratio of the width WelR of the adjacent light-emitting element 100R and the width WelG of the adjacent light-emitting element 100G. Alternatively, the width Wbk(R-G) of the column bank 122Y may be divided equally.

Similarly, of two of the column banks 122Y either side of one of the light-emitting elements 100G, a width Wbk(R-G) of the column bank 122Y disposed between the light-emitting element 100R and an adjacent one of the light-emitting elements 100G is composed of a width WbkR of a portion adjacent to the light-emitting element 100R and a width WbkG of a portion adjacent to the light-emitting element 100G, while a width Wbk(G-B) of the column bank 122Y disposed between the light-emitting element 100G and an adjacent one of the light-emitting elements 100B is composed of a width WbkG of a portion adjacent to the light-emitting element 100G and a width WbkB of a portion adjacent to the light-emitting element 100B. The width WbkG of the portion adjacent to the light-emitting element 100G is defined according to the light emission color of the light-emitting element 100G.

Here too, for the width Wbk(G-B) of the column bank 122Y, the width WbkG and the width WbkB may be set by dividing the width Wbk(G-B) internally according to a ratio of the width WelG of the adjacent light-emitting element 100G and the width WelB of the adjacent light-emitting element 100B. Alternatively, the width Wbk(G-B) of the column bank 122Y may be divided equally.

Further, of two of the column banks 122Y either side of one of the light-emitting elements 100B, a width Wbk(G-B) of the column bank 122Y disposed between the light-emitting element 100G and an adjacent one of the light-emitting elements 100B is composed of a width WbkG of a portion adjacent to the light-emitting element 100G and a width WbkB of a portion adjacent to the light-emitting element 100B, while a width Wbk(B-R) of the column bank 122Y disposed between the light-emitting element 100B and an adjacent one of the light-emitting elements 100R is composed of a width WbkB of a portion adjacent to the light-emitting element 100B and a width WbkR of a portion adjacent to the light-emitting element 100R. The width WbkB of the portion adjacent to the light-emitting element 100B is defined according to the light emission color of the light-emitting element 100B.

Accordingly, the width Wbk(R-G) of the column banks 122Y is defined based on the light emission color of the light-emitting elements 100R and the light emission color of the light-emitting elements 100G. Similarly, the width Wbk (G-B) of the column banks 122Y is defined based on the light emission color of the light-emitting elements 100G and the light emission color of the light-emitting elements 100B. Further, the width Wbk(B-R) of the column banks 122Y is defined based on the light emission color of the light-emitting elements 100B and the light emission color of the light-emitting elements 100R.

According to the display panel 10, the width of each portion of the column banks 122Y adjacent to one of the light-emitting elements 100 is different according to the light emission color of the one of the light-emitting elements 100. More specifically, the width Wbk in the row direction of a portion of the column bank 122Y adjacent to one of the light-emitting elements 100 is smaller when the light-emitting element 100 has a larger value for width Wel in the row direction. More specifically, the widths WelB, WelG, WelR in the row direction of the light-emitting elements 100 are largest to smallest in this order, and therefore the widths WbkB, WbkG, WbkR in the row direction of the portions of the column banks 122Y adjacent to the light-emitting elements 100 are smallest to largest in this order.

The row banks 122X each have a line-like shape extending in the row direction, and in a cross-section taken parallel to the column direction the row banks 122X each have a tapered trapezoid shape that tapers upwards. The row banks 122X extend through the column banks 122Y, and each has a top surface that is lower in height than a top surface 122Yb of the column banks 122Y Thus, the row banks 122X and the column banks 122Y form openings that correspond to the self-luminous areas 100a.

[Hole Transport Layers 121]

As illustrated in FIG. 2 and FIG. 3, the hole transport layers 121 are laminated on the hole injection layers 120 in the gaps 122zR, 122z G, 122zB. The hole transport layers 121 also cover the hole injection layers 120 over the row banks 122X. The hole transport layers 121 are in direct contact with the hole injection layers 120. The hole transport layers 121 have a function of transporting holes injected from the hole injection layers 120 to the light emitting layers 123. According to at least one embodiment, the hole transport layers 121R, 121G, 121B (also referred to as "hole transport layers 121") of the RGB sub-pixels have different film thicknesses according to the color of sub-pixel.

According to the present embodiment, the hole transport layers 121 extend in the column direction along the gaps 122z.

[Light-Emitting Layers 123]

The light-emitting layers 123 are laminated on the hole transport layers 121, as illustrated in FIG. 2 and FIG. 3. The light-emitting layers 123 are made of organic compounds, and have a function of emitting light due to internal recombination of holes and electrons. In the gaps 122zR, 122z G, 122zB defined by the column banks 122Y, the light emitting layers 123R, 123G, 123B each have a line-like shape extending in the column direction.

In the different colors of the sub-pixels 100se are different colors of the light-emitting layers 123 between the pixel electrodes 119 and the counter electrode 125, forming optical resonator structures in which light from the light-emitting layers 123 resonates and is emitted from the counter electrode 125 side. The optical resonator structures are structures with optical distances between the top surfaces of the light-emitting layers 123 and the top surfaces of the pixel electrodes 119 set according to wavelengths of light emitted from the light-emitting layers 123R, 123G, 123B, such that light components corresponding to these colors are strengthened by constructive interference.

Only portions of the light-emitting layers 123 to which carriers are supplied from the pixel electrodes 119 emit light, and therefore electroluminescence of organic compounds does not occur in the non-self-luminous areas 100b where the row banks 122X are present, as the row banks 122X are inter-layer insulators. Thus, areas of the light-emitting layers 123 where the row banks 122X are not present are the self-luminous areas 100a and areas above side and top surfaces 122Xb of the row banks 122X are the non-self-luminous areas 100b.

As previously described, in the different colors of the sub-pixels 100se are different colors of the light-emitting layers 123 between the pixel electrodes 119 and the counter electrode 125, forming optical resonator structures in which light from the light-emitting layers 123 resonates and is emitted from the counter electrode 125 side. In other words, light emitted from each of the light-emitting layers 123R, 123G, 123B, reflected by the pixel electrodes 119, and emitted upwards through the counter electrode 125 constructively interferes with light emitted from each of the light-emitting layers 123R, 123G, 123B directly upwards through the counter electrode 125 to be mutually strengthened. Thus, in order to set the optical distances between the top surfaces of the light-emitting layers 123 and the top surfaces of the pixel electrodes 119 according to wavelengths of light emitted from the light-emitting layers 123R, 123G, 123B to achieve constructive interference of light components of corresponding colors, film thicknesses of the light-emitting layers 123R, 123G, 123B and the hole transport layers 121R, 121G, 121B are made to be different for each color of sub-pixel.

The light-emitting layers 123 extend continuously not just in the self-luminous areas 100a, but also in the non-self-luminous areas 100b that are adjacent. When the light-emitting layers 123 are formed, ink applied to the self-luminous areas 100a can flow in the column direction via ink applied to the non-self-luminous areas 100b, which can even out film thickness among pixels in the column direction. However, in the non-self-luminous areas 100b, the row banks 122X suppress ink flow by an appropriate amount. Accordingly, a large amount of unevenness in film thickness is unlikely to occur, improving evenness of luminance for the pixels.

[Electron Transport Layer 124]

As illustrated in FIG. 2 and FIG. 3, the electron transport layer 124 covers the column banks 122Y and the light-emitting layers 123 in the gaps 122z defined by the column banks 122Y. The electron transport layer 124 is continuous across at least an entire display area of the display panel 10. The electron transport layer 124 has a function of transporting electrons from the counter electrode 125 to the light emitting layers 123 and a function of restricting injection of electrons into the light emitting layers 123.

[Counter Electrode 125]

As illustrated in FIG. 2 and FIG. 3, the counter electrode 123 is formed on the electron transport layer 124. The counter electrode 125 is an electrode common to all of the light-emitting layers 123. The counter electrode 125 is paired with the pixel electrodes 119 to form energization paths sandwiching the light emitting layers 123. The counter electrode 125 supplies carriers to the light emitting layers 123, for example when functioning as a cathode, the counter electrode 125 supplies electrons to the light emitting layers 123.

[Sealing Layer 126]

The sealing layer 126 is laminated on the counter electrode 125 so as to cover the counter electrode 125. The sealing layer 126 is for preventing the light emitting layers 123 from deteriorating due to contact with moisture, air, or the like. The sealing layer 126 is disposed to cover the top surface of the counter electrode 125. The sealing layer must be highly light-transmissive in order to secure good light extraction as a display.

(Materials of Light-Emitting Element Section)

Examples of materials of each of the light-emitting element sections are provided below.

[Substrate 100x (TFT Substrate)]

As the base, for example, a glass substrate, a quartz substrate, a silicon substrate, a metal substrate such as molybdenum sulfide, copper, zinc, aluminum, stainless steel, magnesium, iron, nickel, gold, silver, or the like, a semiconductor substrate such as gallium arsenide, a plastic substrate, or the like can be used.

The TFT layer includes TFT circuits formed on the base, an inorganic insulating layer (not illustrated) formed on the TFT circuits, and the planarization layer 118. Each TFT circuit has a multilayer structure including an electrode, a semiconductor layer, and an insulating layer formed on a top surface of the base.

Known materials can be used for gate electrodes, gate insulating layers, channel layers, channel protective layers, source electrodes, drain electrodes, and the like that are included in the TFT layer.

As a material of the planarizing layer 118, an organic compound such as a polyimide resin, an acrylic resin, a siloxane resin, a novolac resin, or the like can be used.

[Pixel Electrodes 119]

The pixel electrodes 119 are made of a metal material. In the case of a top-emission type of display panel, such as the display panel 10 pertaining to the present embodiment, chromaticity is adjusted and brightness is increased for emitted light due to adoption of the optical resonator structure in which film thicknesses are appropriately set, and therefore surface portions of the pixel electrodes 119 have high reflectivity. According to the display panel 10 pertaining to the present embodiment, the pixel electrodes 119 each have a structure comprising multiple layers selected from metal layers, composite layers, and light-transmissive electrically conductive layers. A metal layer may be made of a material having a small sheet resistance and high light reflectivity, for example, a metal material including aluminum (Al). An aluminum (Al) alloy has a high reflectance of 80% to 95% and a low electrical resistivity of $2.82 \times 10^{-8}$ (10 n$\Omega$m), and is suitable as a material of the pixel electrode 119. Further, in view of cost, a metal layer or alloy layer according to at least one embodiment includes aluminum as a main component.

Aside from aluminum, in view of high reflectance, a metal layer or alloy layer according to at least one embodiment is made of silver or an alloy including silver.

[Hole Injection Layers 120]

The hole injection layers 120 include, for example, an oxide of silver (Ag), molybdenum (Mo), chromium (Cr), vanadium (V), tungsten (W), nickel (Ni), iridium (Ir), or the like. If the hole injection layers 120 are made of a transition metal oxide, multiple valences are taken, achieving a plurality of energy levels, and as a result, hole injection can be facilitated and drive voltage can be reduced.

According to at least one embodiment, the hole injection layers 120 are each a tungsten oxide layer having a film thickness from 2 nm to 30 nm. According to the present embodiment, the film thickness is 10 nm. According to at least one embodiment, the hole injection layers 120 are made of tungsten oxide, but also contain a trace amount of impurities.

According to at least one embodiment, the hole injection layers 120 are made from a coating applied as an organic polymer solution of a conductive polymer material such as poly(3,4-ethylenedioxythiophene) polystyrene sulfonate (PEDOT:PSS).

[Banks 122]

According to at least one embodiment, the banks 122 are made using an organic material such as a resin and are electrical insulators. Examples of the organic material used in forming the banks 122 include acrylic resin, polyimide resin, novolac phenolic resin, or the like. According to at least one embodiment, the banks 122 have organic solvent resistance. According to at least one embodiment, acrylic resin is used. Acrylic resin has a low refractive index and is suitable as a reflector.

Alternatively, when an inorganic material is used for the banks 122, according to at least one embodiment, silicon oxide (SiO) is used in view of the refractive index. According to at least one embodiment, silicon nitride (SiN), silicon oxynitride (SiON), or the like is used as an inorganic material.

Further, according to at least one embodiment, surfaces are treated with fluorine to impart water repellency. According to at least one embodiment, a material containing fluoride is used in forming the banks 122. Further, in order to reduce water repellency on a surface of the banks 122, according to at least one embodiment, the banks 122 are irradiated with ultraviolet light and baked at a low temperature.

[Hole Transport Layers 121]

For the hole transport layers 121, for example, a polyfluorene or a derivative thereof, a polymer compound such as a polyarylamine, which is an amine organic polymer, or a derivative thereof, poly(9,9-di-n-octylfluorene-alt-(1,4-phenylene-((4-sec-butylphenyl)imino)-1,4-phenylene) (TFB), or the like can be used.

[Light-Emitting Layers 123]

Each of the light emitting layers 123 has a function of emitting light generated by an excited state caused by recombination of injected holes and electrons when a voltage is applied. As a material of the light-emitting layers 123, a light-emitting organic material that can be formed into a film by a wet printing method is required.

In particular, for example as disclosed in JP H5-163488 and according to at least one embodiment, the light emitting layers 122 are formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like.

[Electron Transport Layer 124]

According to at least one embodiment, an organic material having a high electron transport property is used for the electron transport layer 124. According to at least one embodiment, the electron transport layer 124 includes a layer made of sodium fluoride. An example of an organic material used for the electron transport layer 124 is a 7E electron low molecular weight organic material such as an oxadiazole derivative (OXD), a triazole derivative (TAZ), a phenanthroline derivative (BCP, Bphen), or the like.

Further, according to at least one embodiment, the electron transport layer 124 includes a layer of the organic material doped with a metal dopant selected from alkali metals or alkaline earth metals.

[Counter Electrode 125]

The counter electrode 125 is formed by using silver (Ag), aluminum (Al), or the like as a thin film electrode.

A light-transmissive electrically-conductive material is used for the counter electrode 125. For example, indium tin oxide (ITO) or indium zinc oxide (IZO) is used.

[Sealing Layer 126]

In the case of a top-emission type of display, the sealing layer 126 is made of a light-transmissive material. According to at least one embodiment, silicon nitride (SiN), silicon oxynitride (SiON), or the like is used as the light-transmissive material. Further, according to at least one embodiment, a sealing resin layer made of a resin material such as acrylic resin, silicone resin, or the like is provided on the layer made using silicon nitride (SiN), silicon oxynitride (SiON), or the like.

(Components of Front Plate 131)

[Upper Substrate 130]

The front plate 131, which includes the upper substrate 130 and the color filter layer 132, is disposed on and joined to the joining layer 127. In a top-emission type of display panel, for example, a light-transmissive material such as cover glass, light-transmissive resin film, or the like is used for the upper substrate 130. Further, the upper substrate 130 can improve rigidity of the display panel 10, and help prevent intrusion of moisture, air, and the like. As the upper substrate 130, according to at least one embodiment, a light-transmissive material such as a glass substrate, a quartz substrate, a plastic substrate or the like is used.

[Color Filter Layer 132]

The color filter layer 132 is formed on the upper substrate 130 at positions corresponding to each of the self-luminous areas 100a of sub-pixels. The color filter layer 132 is a light-transmissive layer that allows transmission of visible light of wavelengths corresponding to R, G, and B and has a function of transmitting light emitted from each color pixel to correct chromaticity of the transmitted light. According to the present embodiment, materials 132R, 132G, 132B of the color filter layer for red, green, and blue are formed above the self-luminous area 100aR in the red gaps 122zR, above the self-luminous area 100aG in the green gaps 122z G, and above the self-luminous area 100aB in the blue gaps 122zB. As the color filter layer 132, a known resin material (as a commercially available product example, color resists manufactured by JSR Corporation) or the like can be used. According to at least one embodiment, film thickness of the color filter layer 132 is from 1 µm to 4 µm. More specifically, for example, the color filter layer 132 is formed by applying inks each containing a color filter layer material and a solvent to a plurality of openings, on the upper substrate 130, in order to form the color filter layer 132 as a matrix of sub-pixel units.

[Light-Shielding Film 133]

As illustrated in FIG. 2 and FIG. 3, the openings 133a are provided at positions corresponding to the self-luminous areas 100a of sub-pixels, and the light-shielding film 133 is formed on the upper substrate 130 to cover positions above the column banks 122Y corresponding to boundaries in the row direction between the self-luminous areas 100a of sub-pixels, and to cover positions above the row banks 122X corresponding to boundaries in the column direction between the self-luminous areas 100a of sub-pixels.

The light-shielding film 133 is a black resin layer provided to prevent transmission of visible light of wavelengths corresponding to R, G, and B. According to at least one embodiment, the light-shielding film 133 is made of a resin material including black pigment with excellent light absorption and light-shielding properties. This structure may be referred to as a black matrix. According to at least one embodiment, the light-shielding film 133 is made of a resin material that is primarily an ultraviolet curable resin (for example, ultraviolet curable acrylic resin) material to which a light-shielding black pigment is added, such as carbon black pigment, titanium black pigment, metal oxide pigment, organic pigment, or the like.

The widths WbmaR, WbmaG, and WbmaB in the row direction of the openings 133a in the light-shielding film 133 are equivalent, regardless of the emission color of the light-emitting elements 100. Further, the widths Wbm(R-G), Wbm(G-B), and Wbm(B-R) in the row direction of crosspieces between the openings 133a are equivalent, regardless of the emission color of the light-emitting elements 100. Here, "crosspiece" indicates a grid-shaped frame of the light-shielding film 133 other than the openings 133a, and includes a pattern extending in the X direction and a pattern extending in the Y direction.

In the display panel 10, as described above, among the light-emitting elements 100 of each pixel, a light-emitting element 100 that has a larger width Wel in the row direction corresponds to a smaller width Wbk of portions of the column banks 122Y adjacent to the light-emitting element 100 than does a light-emitting element 100 that has a smaller width Wel in the row direction. As a result, among the light-emitting elements 100 of each pixel, a light-emitting element 100 that has a larger width Wel in the row direction corresponds to a smaller distance in the row direction between an edge of the light-emitting element 100 and a corresponding one of the openings 133a of the light-shielding film 133 than does a light-emitting element 100 that has a smaller width Wel in the row direction.

More specifically, the widths WelB, WelG, WelR in the row direction of the light-emitting elements 100 are largest to smallest in this order, and therefore the widths WbkB, WbkG, WbkR in the row direction of the portions of the column banks 122Y adjacent to the light-emitting elements 100 are smallest to largest in this order. The distances in the row direction between the edges of the light-emitting elements 100 and the edges of the openings 133a of the light-shielding film 133 are smallest to largest in an order of the light-emitting elements 100B, 100G, 100R.

In the row direction, the light-shielding film 133 overlaps with the column banks 122Y, and according to at least one embodiment, centers in the row direction of each column-direction crosspiece of the light-shielding film 133 align with boundaries between the portions of the column banks 122Y corresponding to the light-emitting elements 100 on both sides.

Further, according to at least one embodiment, in terms of at least a range in the row direction, each of the openings 133a of the light-shielding film 133 include the corresponding light-emitting element 100.

According to at least one embodiment, film thickness of the light-shielding film 133 is from 1 μm to 2 μm.

[Joining Layer 127]

Above the sealing layer 126 in the Z axis direction is the front plate 131 including the upper substrate 130 and the color filter layer 132 disposed below the upper substrate 130. The front plate 131 is joined to the sealing layer 126 by the joining layer 127. The joining layer 127 has a function of joining the front plate 131 to the layers from the substrate 100x to the sealing layer 126, and has a function of preventing each layer from being exposed to moisture and air. According to at least one embodiment, the joining layer 127 is made of a resin adhesive. According to at least one embodiment, the joining layer 127 is made of a light-transmissive resin material such as acrylic resin, silicone resin, epoxy resin, or the like.

<Method of Manufacturing Display Panel 10>

Figure 4:
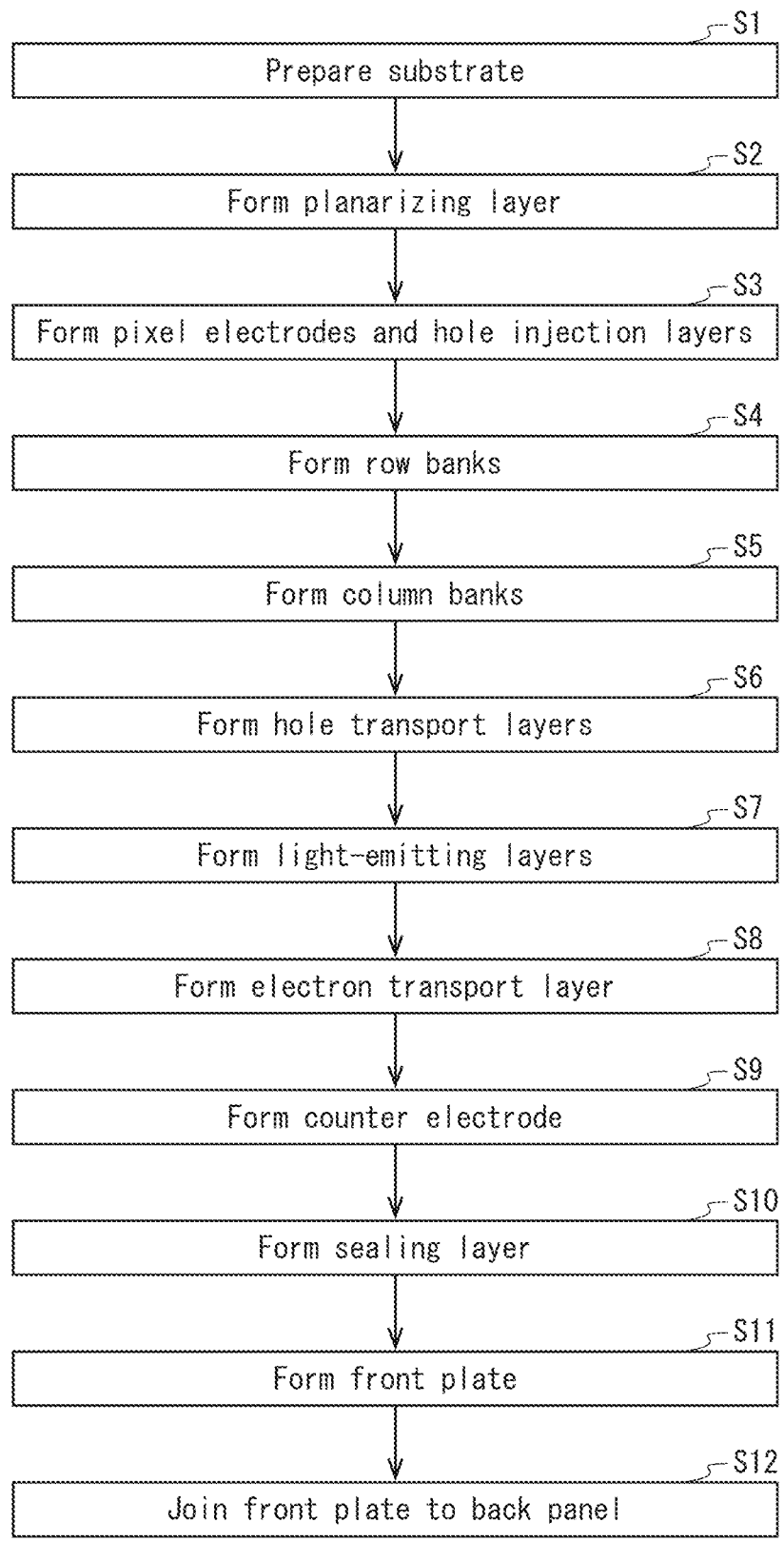
FIG. 4 is a process diagram of a method of manufacturing the organic EL display panel 10, according to at least one embodiment.

The following describes a method of manufacturing the display panel 10, with reference to FIG. 4 to FIG. 9B. FIG. 4 is a flowchart of a method of manufacturing the organic EL display panel 10 according to at least one embodiment. Each of the drawings in FIG. 5A to FIG. 9B is a schematic diagram of a cross section taken at a position corresponding to A1-A1 in FIG. 1, illustrating a state in the method of manufacturing the display panel 10.

[Preparing Substrate 100x]

The substrate 100x is prepared, on which TFTs and wiring are formed. The substrate 100x can be manufactured by a known method of manufacturing TFTs (step S1 in FIG. 4; FIG. 5A).

[Forming Planarizing Layer 118]

The planarizing layer 118 is formed by coating the substrate 100x with a component material (photosensitive resin material) of the planarizing layer 118 as a photoresist, and by planarizing the coated surface (step S2 in FIG. 4; FIG. 5B). More specifically, a resin material having a certain fluidity is applied by, for example, a die coating method along a top surface of the substrate 100x so as to fill unevenness of the substrate 100x caused by the TFT layer. Thus, the top surface of the planarizing layer 118 is planarized.

Contact holes (not illustrated) are formed by dry etching of the planarizing layer 118 at locations corresponding to TFT elements, for example above source electrodes. The contact holes are formed by using patterning or the like, so that the bottoms of the contact holes expose top surfaces of the source electrodes.

Subsequently, connecting electrode layers are formed along inner walls of the contact holes. A portion of each of the connecting electrodes is disposed on the planarizing layer 118.

[Forming Pixel Electrodes 119, Hole Injection Layers 120]

The following describes forming of the pixel electrodes 119 and the hole injection layers 120 (FIG. 4, step S3).

After forming the planarizing layer 118, a surface of the planarizing layer 118 is dry-etched to perform pre-film forming cleaning.

Next, after pre-film forming cleaning of the planarizing layer 118, a pixel electrode metal film 119x for forming the pixel electrodes 119 is formed on the top surface of the planarizing layer 118 by a vapor phase growth method such as a sputtering method or vacuum deposition method (FIG. 5C). According to the present embodiment, the metal film 119x is made of aluminum or an alloy that is primarily aluminum by using a sputtering method.

Further, after pre-film forming cleaning of a surface of the metal film 119x, a hole injection layer metal film 120' for forming the hole injection layers 120 is formed on the surface of the metal film 119x by a vapor deposition method in a vacuum environment (FIG. 5D). According to the present embodiment, the metal film 120' is formed by sputtering tungsten.

Figure 6A:
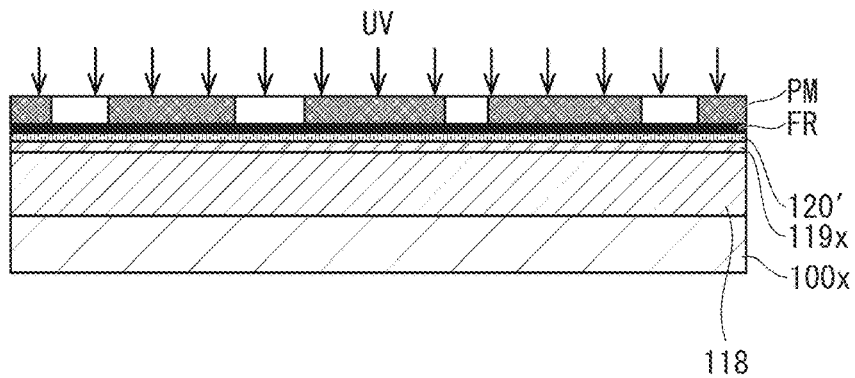
FIGS. 6A, 6B, 6C, and 6D are schematic diagrams of cross-sections taken from the same location as A1-A1 in FIG. 1, illustrating states in manufacturing of the organic EL display panel 10, according to at least one embodiment.

Subsequently, after applying a photoresist layer FR made of a photosensitive resin or the like, a photomask PM provided with defined openings is disposed thereon and irradiated with ultraviolet light to expose the photoresist and transfer the pattern of the photomask to the photoresist (FIG. 6A). Next, the photoresist layer FR is patterned by developing.

Next, through the patterned photoresist layer FR, the metal film 120' is subjected to dry etching processing to perform patterning, forming the hole injection layers 120.

Next, through the patterned photoresist layer FR, the metal film 119x is subjected to wet etching processing to perform patterning, forming the pixel electrodes 119.

According to at least one embodiment, the hole injection layers 120 and the pixel electrodes 119 are processed at the same time by dry etching.

Figure 6B:
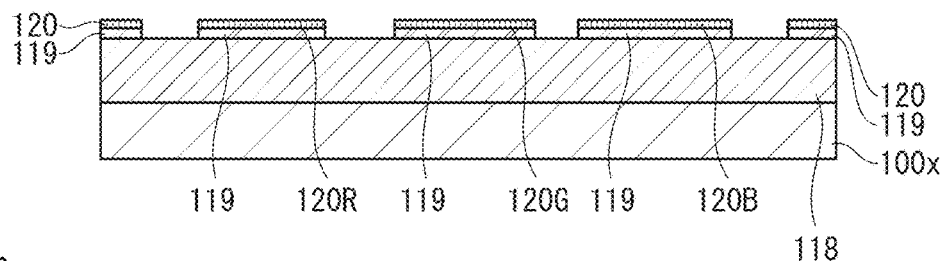

Finally, the photoresist layer FR is peeled off to leave behind laminated layers of the pixel electrodes 119 and the hole injection layers 120 (FIG. 6B).

[Forming the Banks 122]

Figure 6C:
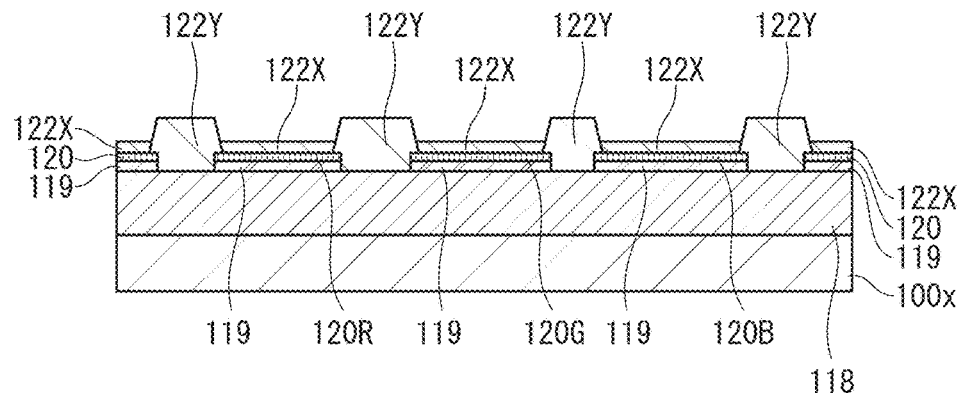

After forming the hole injection layers 120, the banks 122 are formed covering the hole injection layers 120. In forming the banks 122, the row banks 122X are formed first, and subsequently the column banks 122Y are formed so as to define the gaps 122z (FIG. 4, step S4; FIG. 6C).

In forming the row banks 122X, a film made of a material of the row banks 122X (for example, a photosensitive resin material) is laminated on the hole injection layers 120 and the planarizing layer 118 by using a spin coating method or the like. The film is then patterned to form the row banks 122X.

The patterning of the row banks 122X is achieved by exposure using a photomask above the film, then performing developing and baking steps (at approximately 230° C. for approximately 60 minutes).

In forming the column banks 122Y, a film made of a material of the column banks 122Y (for example, a photosensitive resin material) is laminated on the hole injection layers 120, the row banks 122X, and the planarizing layer 118 by using a spin coating method or the like. Then the column banks 122Y are formed by exposure using a photomask above the film, then developing to form the column banks 122Yz.

More specifically, according to at least one embodiment, the method of forming the column banks 122Y is first to form a photosensitive resin film made of an organic photosensitive resin material such as acrylic resin, polyimide resin, novolac phenolic resin, or the like, then drying the resin film, and after a solvent of the resin film is evaporated to a defined extent, a photomask provided with defined openings is overlaid, and the photomask and photoresist made of the photosensitive resin are irradiated with ultraviolet light, transferring the pattern of the photomask to the photoresist.

Next, the photosensitive resin is developed and a resulting patterned insulating layer is baked (at approximately 230° C. for approximately 60 minutes) to form the column banks 122Y.

As described above, the hole injection layers 120 are formed by forming a film made of metal (for example, tungsten) by using a vapor phase growth method such as sputtering or vacuum deposition then using photolithography and etching to pattern each pixel unit, but in the baking process for the row banks 122X and the column banks 122Y, the metal of the hole injection layers 120 is oxidized and the hole injection layers 120 are actually completed.

[Forming Organic Functional Layers]

Figure 6D:
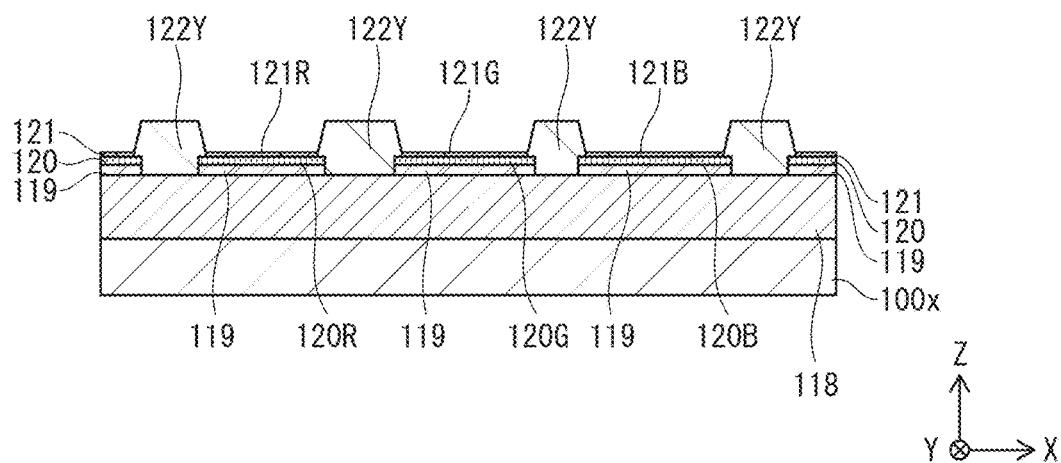
Figure 7A:
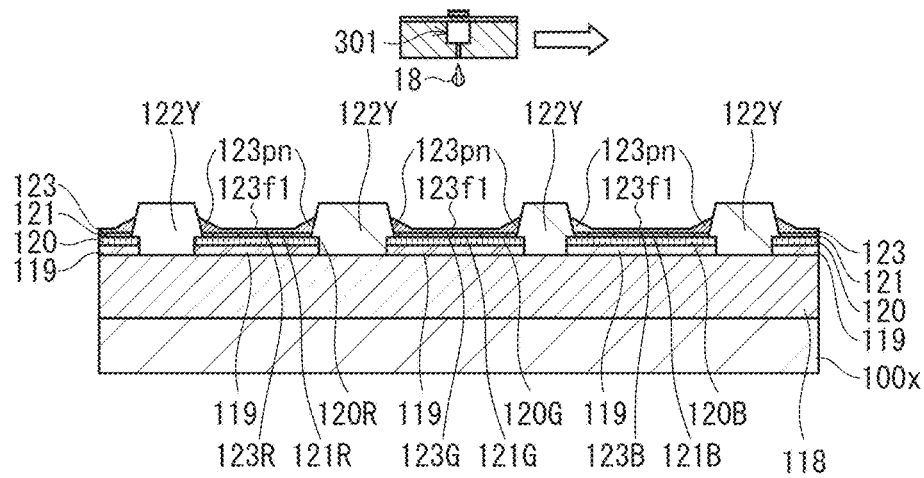
FIGS. 7A, 7B, 7C, and 7D are schematic diagrams of cross-sections taken from the same location as A1-A1 in FIG. 1, illustrating states in manufacturing of the organic EL display panel 10, according to at least one embodiment.

The hole transport layers 121 and the light emitting layers 123 are laminated in this order on the hole injection layers 120 formed in the gaps 122z defined by the column banks 122Y, including on the row banks 122X (FIG. 4, steps S6, S7; FIG. 6D and FIG. 7A).

Using an inkjet method, inks containing an electrically conductive polymer material such as poly(3,4-ethylenedioxythiophene) polystyrene sulfonate (PEDOT:PSS) are applied to upper surfaces of the hole injection layers 120 in the gaps 122z defined by the column banks 122Y, then a solvent is volatized or baked. Subsequently, according to at least one embodiment, photolithography and etching is used to pattern pixel units to form upper layers of the hole injection layers (not illustrated).

The hole transport layers 121 are formed by using a wet process such an inkjet method or gravure printing method to apply ink including a material of the hole transport layers 121 into the gaps 122z defined by the column banks 122Y, then removing a solvent of the ink by volatilization or by baking.

The light emitting layers 123 are formed by using an inkjet method to apply inks including materials of the light emitting layers 123 into the gaps 122z defined by the column banks 122Y, then baking (FIG. 4, step S6; FIG. 7A). More specifically, the substrate 100x is placed on an operation table of a droplet discharge device such that the column banks 122Y are aligned along the Y direction, and an inkjet head 301 in which nozzle holes are lined up along the Y direction (Y axis in FIG. 7A) is moved relative to the substrate 100x in the X direction while ink droplets 18 are discharged from the nozzle holes aimed at landing targets set within the gaps 122z between the column banks 122Y.

In this process, inks 123RI, 123GI, 123BI each containing a corresponding organic light-emitting layer material for red, green, or blue is discharged into corresponding ones of the gaps 122z, the inks are baked under low pressure, and the light-emitting layers 123R, 123G, 123B are formed by the baking. In applying the inks of the light-emitting layers 123, first, an ink for forming the light-emitting layers 123 is applied using the droplet discharge device.

Upon completion of application of ink for forming any one of the red light emitting layers, the green light emitting layers, and the blue light emitting layers with respect to the substrate 100x, another color of ink is applied with respect to the substrate 100x, then the third color of ink is applied. By repeating this process, three colors of ink are applied in order. As a result, red light-emitting layers, green light-emitting layers, and blue light-emitting layers are formed on the substrate 100x by repetition in the X axis direction.

Note that the method for forming the hole transport layers 121 and the light emitting layers 123 is not limited to a method described above, and known methods such as a dispenser method, a nozzle coating method, a spin coating method, intaglio printing, relief printing, and the like may be used to drop and/or apply ink.

[Forming Electron Transport Layer 124]

Figure 7B:
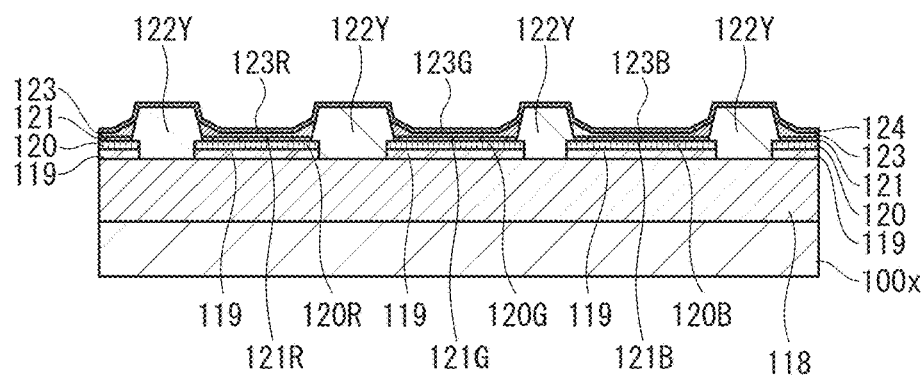

After forming the light-emitting layers 123, the electron transport layer 124 is formed across an entire light-emission area (display area) of the display panel 10 by a vacuum deposition method or the like (FIG. 4, step S8; FIG. 7B). Reasons for using vacuum deposition are to avoid damage to the light emitting layers 123, which are organic, and because, in a vacuum deposition method performed under high vacuum, molecules to form a film proceed directly in a direction normal to the substrate. The electron transport layer 124 is formed by depositing a metal oxide or fluoride on the light emitting layers 123 by a vacuum deposition method or the like, and further depositing an organic material and a metal material by a co-evaporation deposition method. Note that film thickness of the electron transport layer 124 is set to be a film thickness most appropriate for optical light extraction.

[Forming Counter Electrode 125]

Figure 7C:
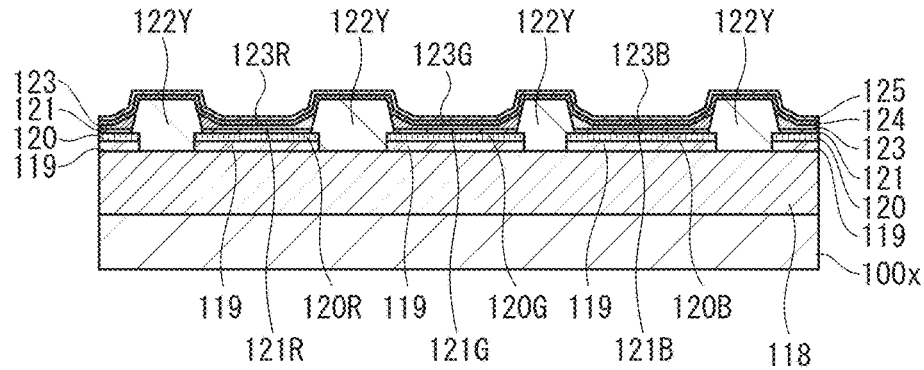

After forming the electron transport layer 124, the counter electrode 125 is formed so as to cover the electron transport layer 124 (FIG. 4, step S9; FIG. 7C).

The counter electrode 125 is formed by a chemical vapor deposition (CVD) method, a sputtering method, or a vacuum deposition method to cover the electron transport layer 124. According to the present embodiment, the counter electrode 125 is formed by deposition of silver by a vacuum deposition method.

Next, a light-transmissive electrically conductive layer of ITO, IZO, or the like is formed by using a sputtering method.

[Forming Sealing Layer 126]

Figure 7D:
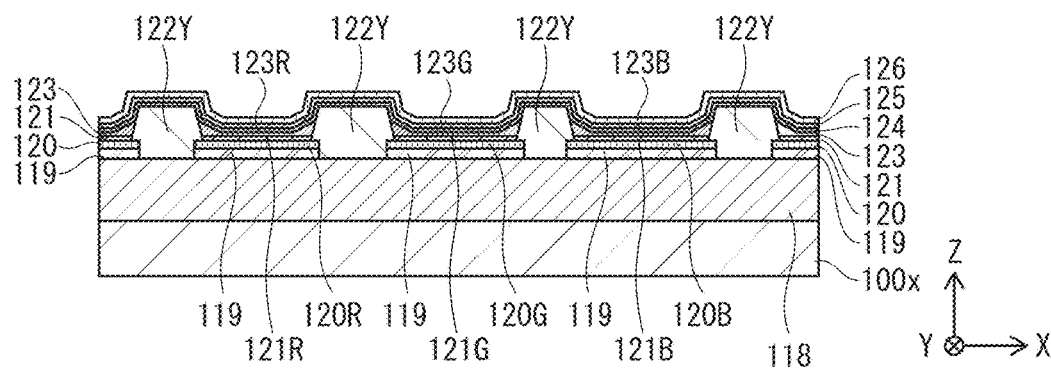

The sealing layer 126 is formed so as to cover the counter electrode 125 (FIG. 4, step S10; FIG. 7D). According to at least one embodiment, the sealing layer 126 is formed by using a CVD method, a sputtering method, or the like.

[Forming Front Plate 131]

The following describes the method of manufacturing the front plate 131 referred to as step S10 in FIG. 4. FIGS. 8A, 8B, 8C, 8D, 8E, 8F, and 8G are schematic diagrams of cross-sections taken from the same location as A1-A1 in FIG. 1, illustrating states in manufacturing of the organic EL display panel 10, according to at least one embodiment.

First, the upper substrate 130, which is light-transmissive, is prepared, and a light-shielding film material 133' including an ultraviolet light-curable resin as a main component (for example, an ultraviolet light-curable acrylic resin) to which a black pigment is added is applied to one surface of the upper substrate 130.

Figure 8A:
FIGS. 8A, 8B, 8C, 8D, 8E, 8F, and 8G are schematic diagrams of cross-sections taken from the same location as A1-A1 in FIG. 1, illustrating states in manufacturing of the organic EL display panel 10, according to at least one embodiment.
Figure 8B:
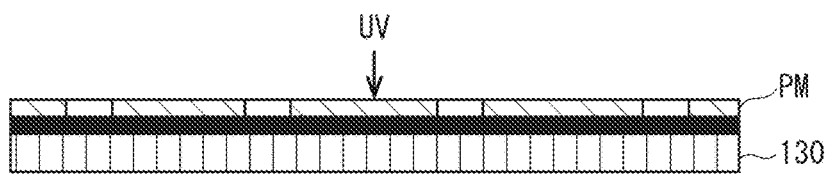

A pattern mask PM having defined openings is overlaid on an upper surface of the light-shielding film material 133' and is irradiated from above with ultraviolet light (FIG. 8B).

Figure 8C:
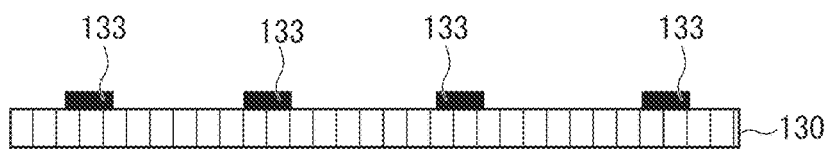
Figure 8D:
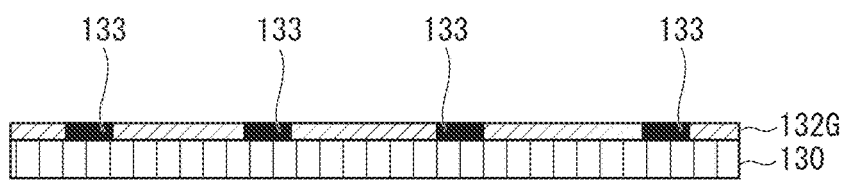

Then, by removing the pattern mask PM and uncured portions of the light-shielding film material film 133', developing, and curing, the light-shielding film 133 is completed and has, for example, substantially rectangular shapes in cross section (FIG. 8C). The light-shielding film 133 is patterned to correspond to boundaries in the row and column directions between the self-luminous areas 100a of sub-pixels above the banks 122 formed on the substrate 100x, when the light-shielding film 133 faces the substrate 100x.

Figure 8E:
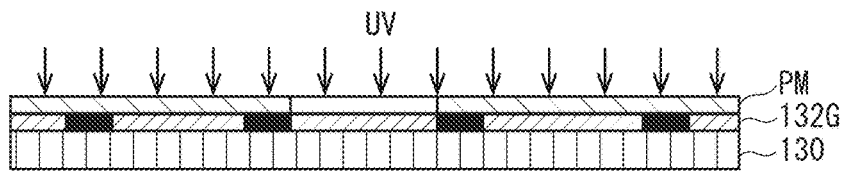

Next, for example, the material 132G of the color filter layer 132 with ultraviolet light curable resin as a main component is applied on a surface of the upper substrate 130 on which the light-shielding film 133 is formed (FIG. 8D), then a defined pattern mask PM is placed and ultraviolet light irradiation is performed (FIG. 8E).

Figure 8F:
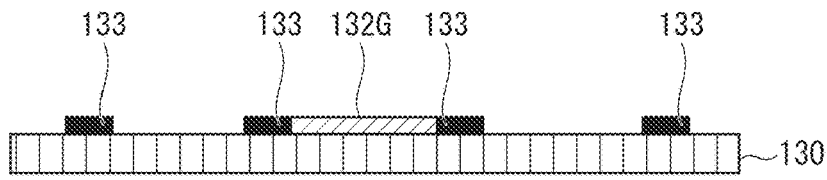

Subsequently, curing is performed, and the pattern mask PM and uncured portions of the material 132G are removed by developing to form the color filter layer 132(G) (FIG. 8F).

Figure 8G:
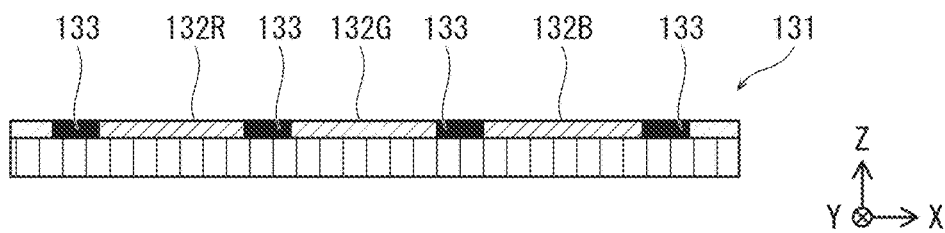

By repeating this process for each color of color filter material, the color filter layer 132(R)(B) is formed (FIG. 8G). This completes the front plate 131.

[Joining Front Plate 131 and Back Panel]

Figure 9A:
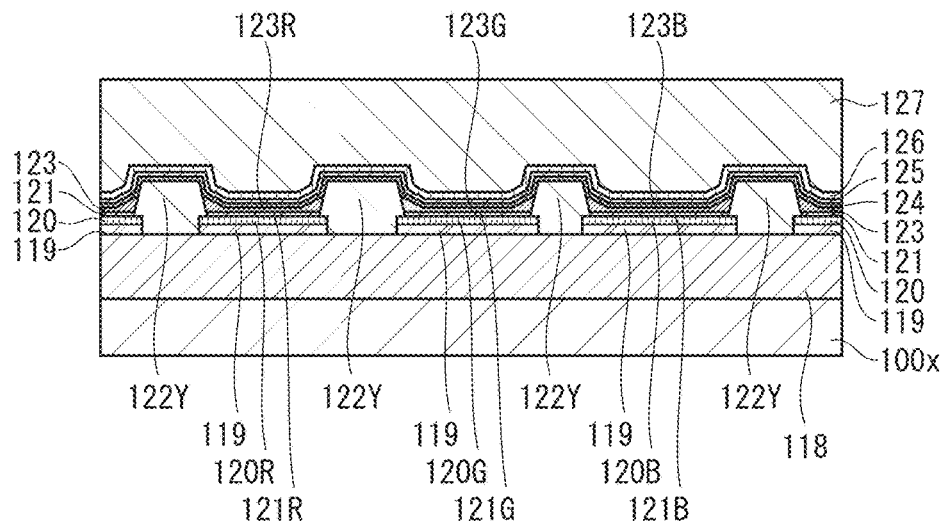
FIGS. 9A and 9B are schematic diagrams of cross-sections taken from the same location as A1-A1 in FIG. 1, illustrating states in manufacturing of the organic EL display panel 10, according to at least one embodiment.

Next, a material of the joining layer 127 that includes an ultraviolet light curable resin as a main component, such as acrylic resin, silicone resin, epoxy resin, or the like, is applied to a back panel that includes every layer from the substrate 100x to the sealing layer 126 (FIG. 9A).

Figure 9B:
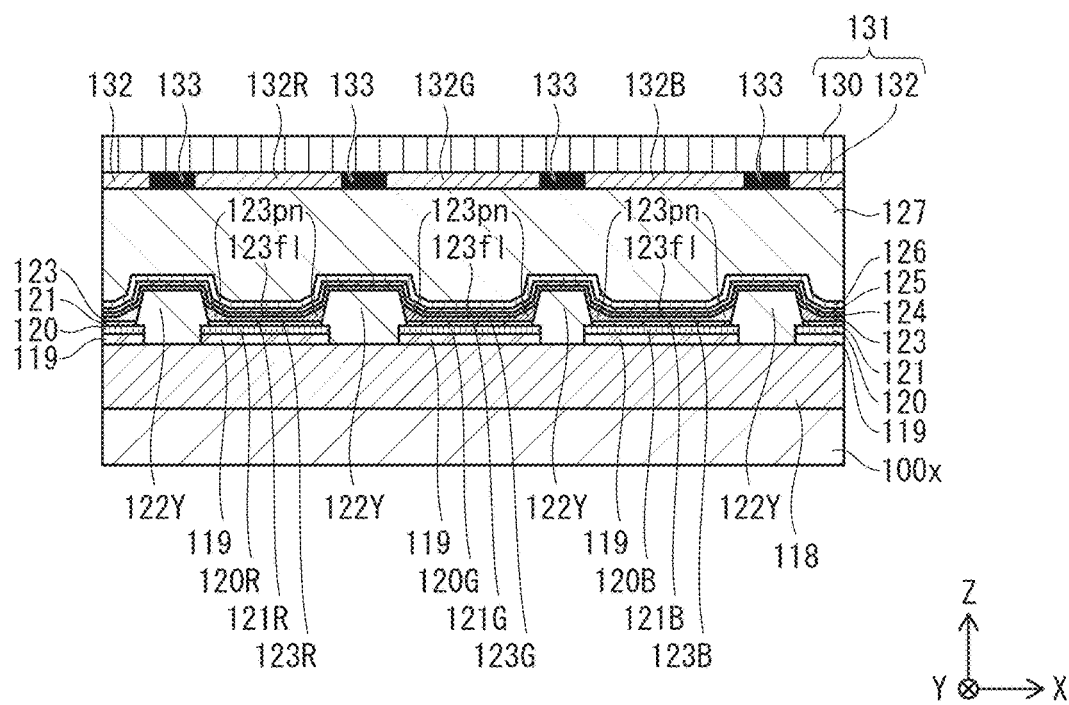

Next, the applied material is irradiated with ultraviolet light, and the back panel and the front panel 131 are joined while matching positions relative to each other. Care is taken that gas does not enter between the back panel and the front panel 131. Subsequently, when both panels are baked and a sealing process is completed, the display panel 10 is completed (FIG. 9B).

The light-shielding film 133 on the front plate 131 is aligned to correspond to boundaries in the row and column directions between the self-luminous areas 100a of sub-pixels above the banks 122 formed on the substrate 100x.

<Effects>

The following describes effects of the display panel 10.

FIG. 10A, 10B, 11A, 11B are enlargements of cross-sections of light-emitting elements of reference examples in which widths of the openings 133a of the light-shielding film 133 of the display panel 10 are different.

As illustrated in FIG. 10A, when the light-emitting element width is Wel0, width of the opening 133a of the light-shielding film 133 is Wbma0, and an optical distance between the light emission reference point and the light-shielding film 133 is Ly0, a light-shielding width when viewed from a line of sight C at a viewing angle of a is Lx0, and the light-shielding ratio is Lx0/Wel0.

Next, as illustrated in FIG. 10B, when the light-emitting element width is reduced to Wel1, which is shorter than the width Wel0, a width Wbma0 of the opening 133a of the light-shielding film 133 is also reduced by the same amount. In this case, the light-shielding width Lx0 when viewed from the viewing angle α does not change, but the light-shielding ratio Lx0/Wel1 is greater than Lx0/Wel0. Thus, luminance when viewed from the viewing angle α is reduced according to the light-shielding ratio.

Regarding the display panel illustrated in FIG. 10B, the width Wbma1 of the opening 133a of the light-shielding film 133 may be increased in order to change the light-shielding ratio Lx0/Wel1. For example, as illustrated in FIG. 11A, when the width Wbma1 of the opening 133a of the light-shielding film 133 is increased to the width Wbm0, the shielding width when viewed from the viewing angle α becomes Lx1, which is smaller than Lx0, and the light-shielding ratio becomes Lx1/Wel1, which is larger than Lx0/Wel1. Thus, luminance when viewed from the viewing angle α is improved (increased) by the reduction in the light-shielding ratio.

However, when an increase in the width Wbma0 is limited in order to ensure a minimum value allowed in a manufacturing process of the width Wbm1 of portions of the crosspiece between the openings 133a of the light-shielding film 133, in some cases the light-shielding value and the light-shielding ratio cannot be sufficiently reduced. With respect to the display panel of FIG. 11A, the width in the row direction of the column banks 122Y can be increased from Wbk0 to Wbk1, thereby allowing restoration of the width Wbm1 of the portion of the crosspiece between the openings 133a of the light-shielding film 133 to the larger width Wbm0, as illustrated in FIG. 11B, and as in the display panel 10 pertaining to the present embodiment. As a result, the light-shielding ratio can be set to Lx1/Wel1, which is smaller than Lx0/Wel1, while also ensuring that the minimum width of the crosspieces of the light-shielding film 133 is a value allowed in the manufacturing process thereof. As a result, luminance when viewed from the viewing angle α is improved (increased) by the reduction in the light-shielding ratio.

According to the present embodiment, as described above, the lengths 119x (B), (G), (R) in the row direction of the pixel electrodes 119 of the light-emitting elements 100B, 100G, 100R are configured from longest (B) to shortest (R).

When viewing the display panel 10X from the direction of the line of sight C at the viewing angle α, the light-shielding ratio Lx/Wel with respect to the widths Wel for the light emitting elements 100 goes from largest to smallest in the order of 100R, 100G, 100B. Thus, a reduction rate in luminance visually recognized by a viewer from the light-emitting elements 100 goes from most to least in the order 100R, 100G, 100B, and therefore luminance balance from the light-emitting elements 100R, 100G, 100B changes and visually recognized chromaticity changes, and this is visually recognized as a chromaticity shift in grays and midtones when viewing from an oblique angle.

In contrast, according to the display panel 10, as described above, among the light-emitting elements 100 of each pixel, a light-emitting element 100 that has a larger value for the width Wel in the row direction has a smaller value for the width Wbk of the portions of the column banks 122Y adjacent to the light-emitting element 100 in the row direction, and a smaller value for the distance in the row direction between the edges of the opening 133a of the light-shielding film 133 and the edges of the light-emitting element 100, than does a light-emitting element 100 that has a smaller value for the width Wel. In other words, according to the present embodiment, in the row direction, the widths of the light-emitting elements 100 go from largest to smallest in the order 100B, 100G, 100R, the widths Wbk of the portions of the banks 122Y adjacent to the light-emitting elements 100 go from smallest to largest in the order WbkB, WbkG, WbkR, and the distances between the edges of the openings 133a of the light-shielding film 133 and the edges of the light-emitting elements 100 go from smallest to largest in the order 100B, 100G, 100R. Thus, an increase in light-shielding ratio that accompanies a decrease in the width Wbk of the portions of the column banks 122Y adjacent to the light-emitting elements 100 goes from largest to smallest in order 100B, 100G, 100R.

Thus, by implementing changes in a direction that cancels out differences in light-shielding ratio of the light-emitting elements 100B, 100G, 100R, the differences in light-shielding ratio can be compensated for, and changes in visual recognition of chromaticity when viewed from an oblique angle can thereby be reduced.

According to the display panel 10, when the widths Wel of the light-emitting elements 100 of pixels are different from each other, the light-emitting elements 100 with a relatively small width Wel are associated with larger values for the widths Wbk of the portions of the column banks 122Y adjacent to the light-emitting element 100, and therefore the light-shielding ratio is reduced to fit small values of the width Wel.

As a result, in a high definition organic EL display panel, even when pixel density is increased and unit areas of the light-emitting elements 100 are decreased, a self-luminous display panel structure can be realized that reduces changes in chromaticity of emitted light when a display image is viewed from an oblique angle of 45° or more from the front.

<Review>

As described above, the display panel 10 pertaining to at least one embodiment is a self-luminous display panel in which the pixels composed of the sub-pixels 100se are arranged in a matrix of rows and columns, including the light-emitting elements 100, the column banks 122Y, and the light-shielding film 133. The light-emitting elements 100 correspond one-to-one with the sub-pixels 100se, each sub-pixel 100se in a pixel emitting a different color of light. The column banks 122Y are disposed between the light-emitting elements 100 in a row direction, each of the column banks 122Y having an elongated shape in a column direction. The light-shielding film 133 is provided with the openings 133a at positions corresponding to the light-emitting elements 100 in plan view, downstream in a light emission direction of the light-emitting elements 100. In plan view, distances in the row direction between edges of the openings 133a of the light-shielding film 133 and defined points of the light-emitting elements 100 are different depending on light emission color of the light-emitting elements 100, due to different widths of portions of the column banks 122Y adjacent to the light-emitting elements 100.

According to this structure, in a high definition organic EL display panel, even when pixel density is increased and unit areas of the light-emitting elements 100 are decreased, a self-luminous display panel structure can be realized that reduces changes in chromaticity of emitted light when a display image is viewed from an oblique angle.

<<Circuit Structure of Organic EL Display Device 1>>

Figure 12:
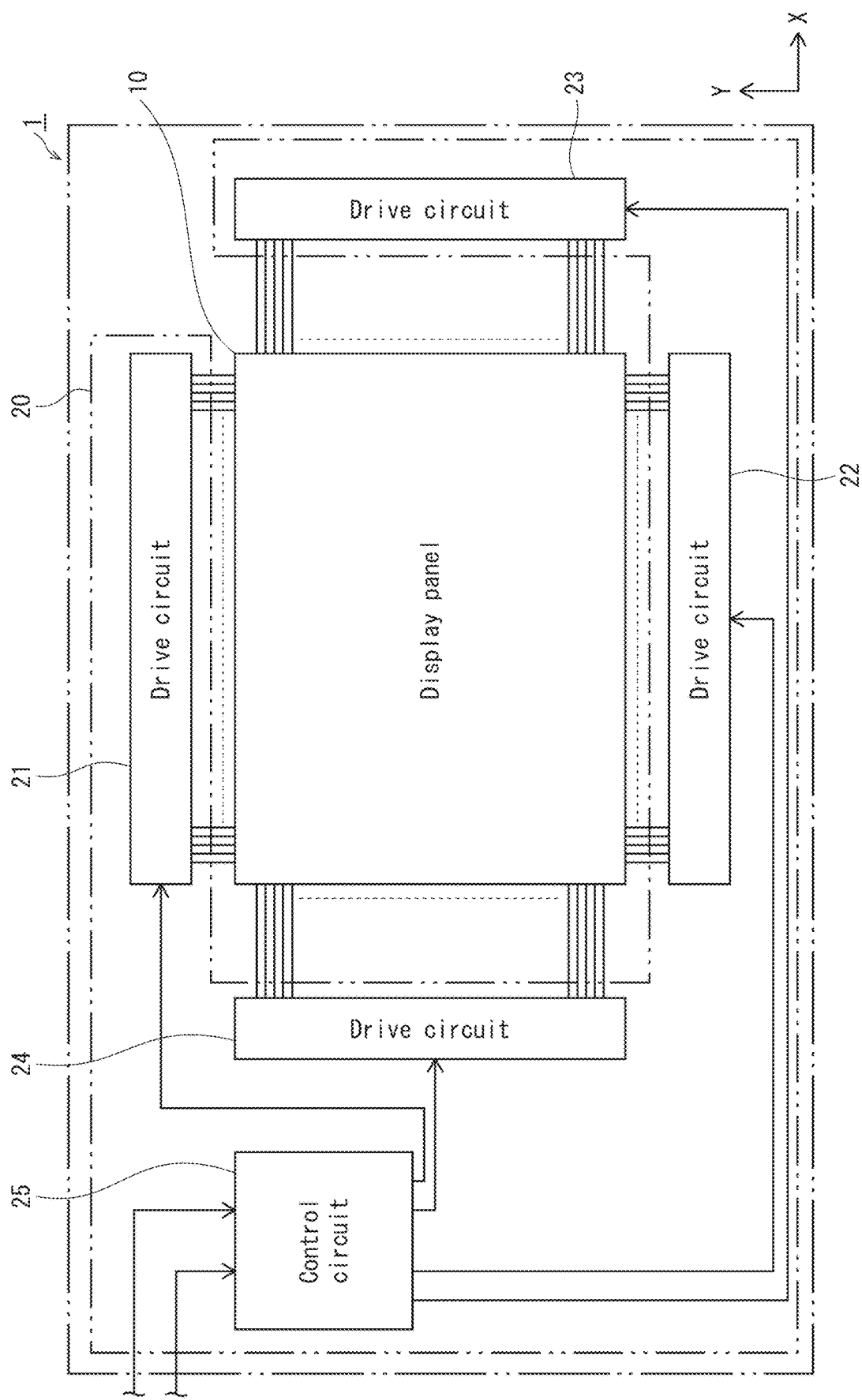
FIG. 12 is a schematic block diagram illustrating circuit structure of an organic EL display device according to at least one embodiment.

The following describes circuit structure of an organic EL display device 1 (also referred to as "display device 1") that uses the display panel 10 pertaining to at least one embodiment, with reference to FIG. 12.

As illustrated in FIG. 12, the display device 1 includes the display panel 10 and drive control circuitry 20 connected to the display panel 10.

The display panel 10 includes a plurality of organic EL elements arranged in a matrix, for example. The drive control circuitry 20 includes four drive circuits 21, 22, 23, 24 and a control circuit 25.

In the display panel 10, the pixels 100e are arranged in a matrix, forming a display area. Each of the unit pixels 100e is composed of three organic EL elements, or in other words three sub-pixels 100se that emit light in three different colors, red (R), green (G), and blue (B). Circuit structure of each of the sub-pixels 100se is described below, with reference to FIG. 13.

Figure 13:
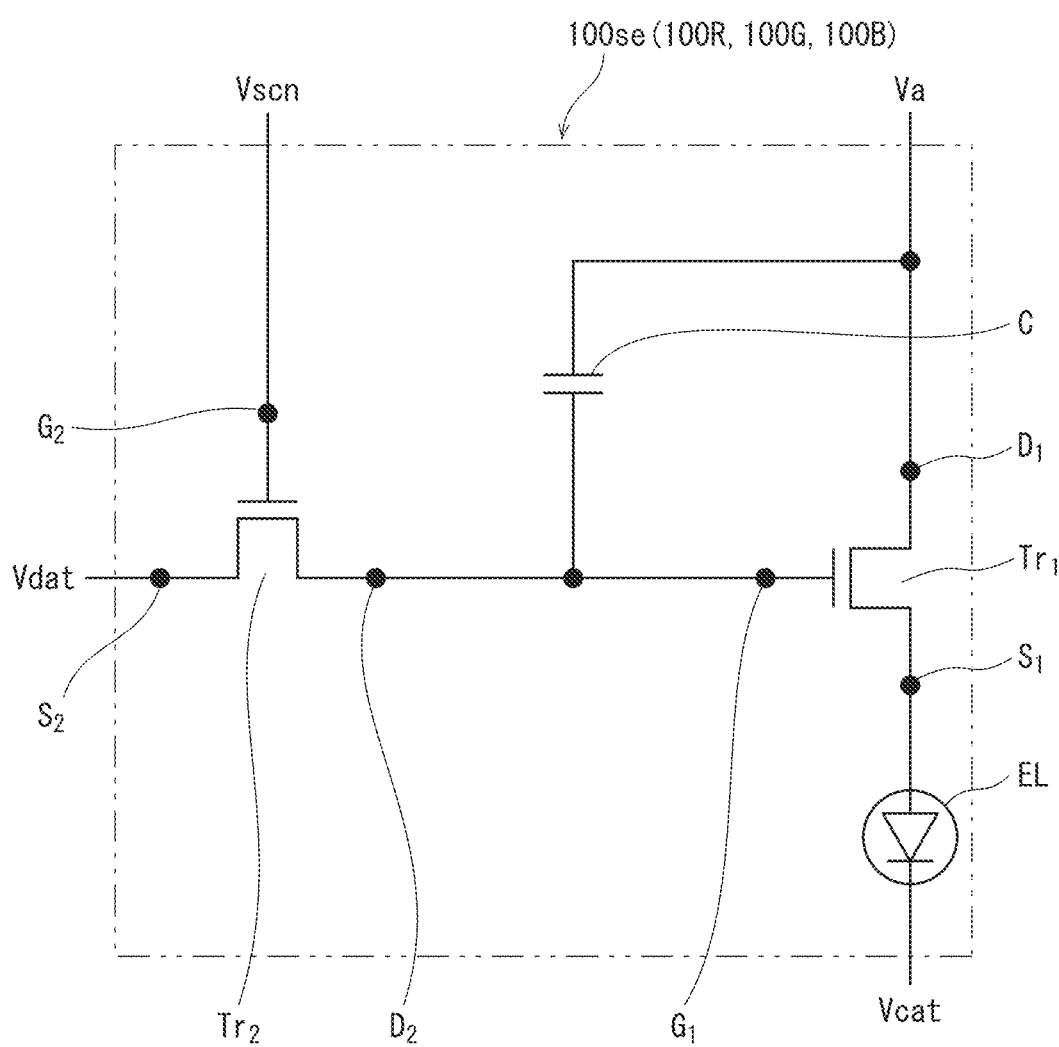
FIG. 13 is a schematic circuit diagram illustrating circuit structure of a sub-pixel 100*se* of the organic EL display panel 10 used in an organic EL display device according to at least one embodiment.

FIG. 13 is a schematic circuit diagram illustrating circuit structure in each of the light-emitting elements 100 corresponding to the sub-pixels 100se of the display panel 10 in the display device 1.

As illustrated in FIG. 13, according to the display panel 10 pertaining to the present embodiment, each of the sub-pixels 100se includes two transistors $Tr_1$, $Tr_2$, a capacitor C, and an organic EL element EL as a light-emitting element. The transistor $Tr_1$ is a drive transistor and the transistor $Tr_2$ is a switching transistor.

A gate $G_2$ of the switching transistor $Tr_2$ is connected to a scan line Vscn, and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power source line Va, and a source $S_1$ is connected to a pixel electrode (anode) of the organic EL element EL. A counter electrode (cathode) of the organic EL element EL is connected to a ground line Vcat.

A first end of the capacitor C is connected to the drain $D_2$ of the switching transistor $Tr_2$ and the gate $G_1$ of the drive transistor $Tr_1$, and a second end of the capacitor C is connected to the power source line Va.

In the display panel 10, a plurality of adjacent sub-pixels 100se (for example, three sub-pixels 100se with light emission colors red (R), green (G), and blue (B)) are combined to form one unit pixel 100e, and the unit pixels 100e are distributed to form a pixel area. For each of the sub-pixels 100se, a gate line leads out from the gate $G_2$ and is connected to scan line Vscn connected from outside the display panel 10. Similarly, for each of the sub-pixels 100se, a source line leads out from the source $S_2$ and is connected to the data line Vdat connected from outside the display panel 10.

Further, power source lines Va and ground lines Vcat of the sub-pixels 100se are aggregated and connected to a power source line and a ground line of the display device 1.

<<Modifications>>

The display panel 10 pertaining to at least one embodiment has been described, but the present disclosure is not limited to the embodiments described above. For example, various modifications achievable by a person having ordinary skill in the art, and any combination of elements and functions of embodiments and modifications that do not depart from the spirit of the present invention are also included in the present disclosure. The following describes modifications of the organic EL display panel as examples of such embodiments.

<Modification 1>

According to the display panel 10 pertaining to at least one embodiment, the widths Wbma(R-G), Wbma(G-B), Wbma(B-R) in the row direction of the openings 133a in the light-shielding film 133 are equivalent regardless of the light emission colors of the light-emitting elements 100, and the widths Wbm(R-G), Wbm(G-B), Wbm(B-R) in the row direction of the portions of the crosspieces between the openings 133a are also equivalent regardless of the light emission colors of the light-emitting elements 100. According to a display panel 10A pertaining to Modification 1, the widths Wbm(R-G), Wbm(G-B), Wbm(B-R) in the row direction of the crosspieces between the openings 133a are different depending on light emission colors of the light-emitting elements 100, and as a result, the widths Wbma (R-G), Wbma(G-B), Wbma(B-R) in the row direction of the openings 133a of the light-shielding film 133 are also different depending on light emission colors of the light-emitting elements 100.

Figure 14:
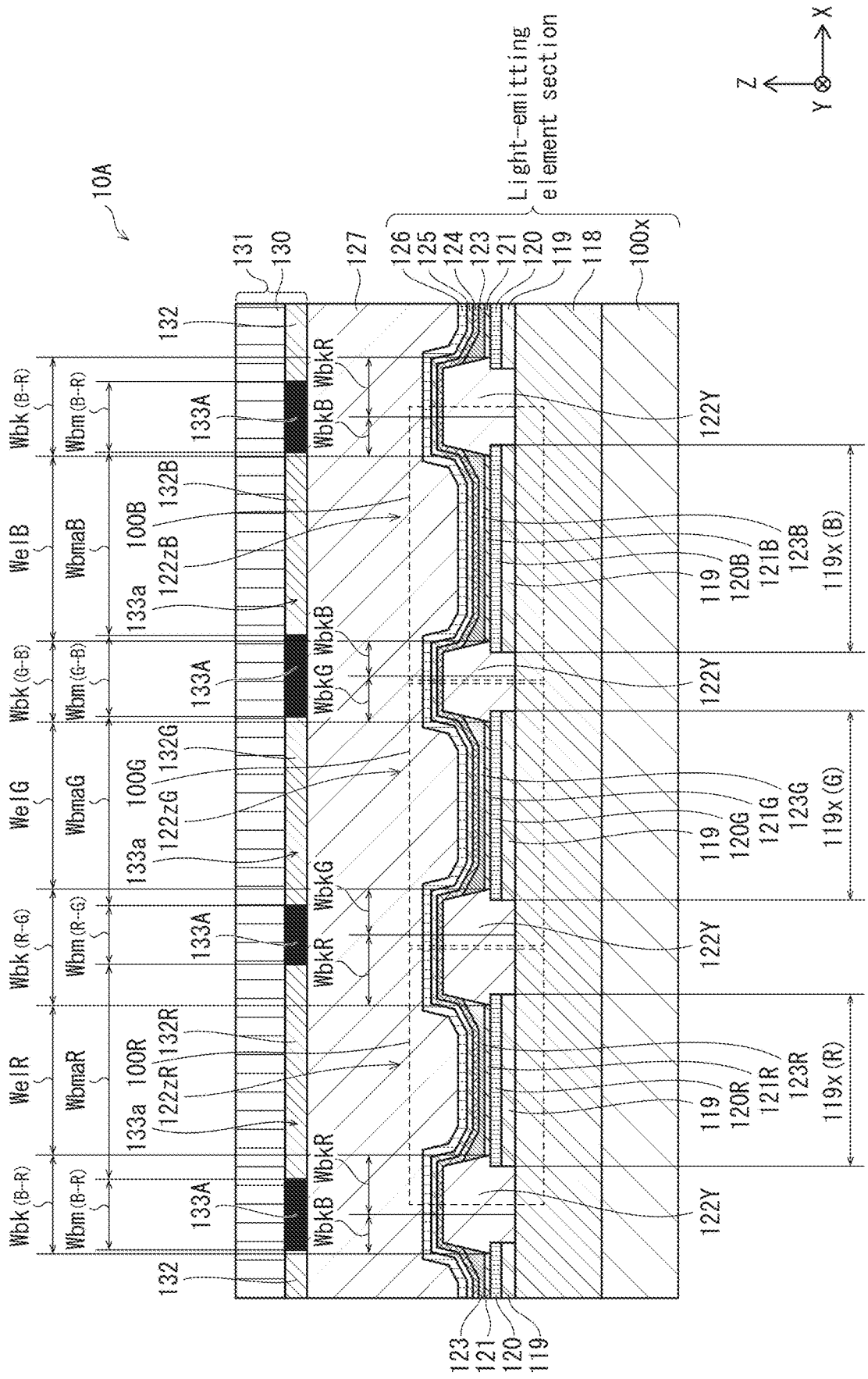
FIG. 14 is a schematic diagram of a cross-section taken from the same location as line A1-A1 in FIG. 1 from an organic EL display panel 10A according to Modification 1.

FIG. 14 is a schematic cross section diagram taken along a same position as A1-A1 in FIG. 1, illustrating the display panel 10A pertaining to Modification 1. As illustrated in FIG. 14, according to the display panel 10A pertaining to Modification 1, among the crosspieces between the openings 133a of the light-shielding film 133, widths Wbk in the row direction of the column banks 122Y facing crosspiece portions having a relatively small value for the width Wbm are larger than widths Wbk in the row direction of the column banks 122Y facing crosspiece portions having a relatively large value for the width Wbm. More specifically, as illustrated in FIG. 14, according to the display panel 10A, in the row direction of each pixel, a crosspiece of the light-shielding film 133 above a portion of the column bank 122Y that has a large width Wbk has a smaller width than a crosspiece of the light-shielding film 133 above a portion of the column bank 122Y that has a small width Wbk.

According to the display panel 10A, when the widths Wel of the light-emitting elements 100 of pixels are different from each other, the light-emitting elements 100 with a relatively small width Wel are associated with larger values for the widths Wbk of the portions of the column banks 122Y adjacent to the light-emitting element 100, and therefore the light-shielding ratio is further reduced for small values of the width Wel over the reduction achieved by the display panel 10, by reducing widths in the row direction of the crosspieces of the light-shielding film 133.

<Modification 2>

According to the display panel 10 pertaining to at least one embodiment, a maximum distance LB in a light emission direction between a light emission reference point of the light-emitting elements 100B and an edge of the openings 133a of the light-shielding film 133 is longer than a maximum distance for the light-emitting elements 100R, 100G. According to at least one embodiment, as described above, the lengths 119x (B), (G), (R) in the row direction of the pixel electrodes 119 of the light-emitting elements 100B, 100G, 100R are configured from longest (B) to shortest (R), such that the light-shielding ratio of the light-emitting elements 100B is smallest. By adopting the structure described above of the display panel 10, the light-shielding ratios are increased for the light-emitting elements that have the longest length of the pixel electrodes 119 in the row direction, effectively compensating for changes in light-shielding ratios due to light emission color.

However, there are factors other than the lengths 119x in the row direction of the pixel electrodes 119 that can cause light-shielding ratios of the light-emitting elements 100 to be different from each other.

Figure 15:
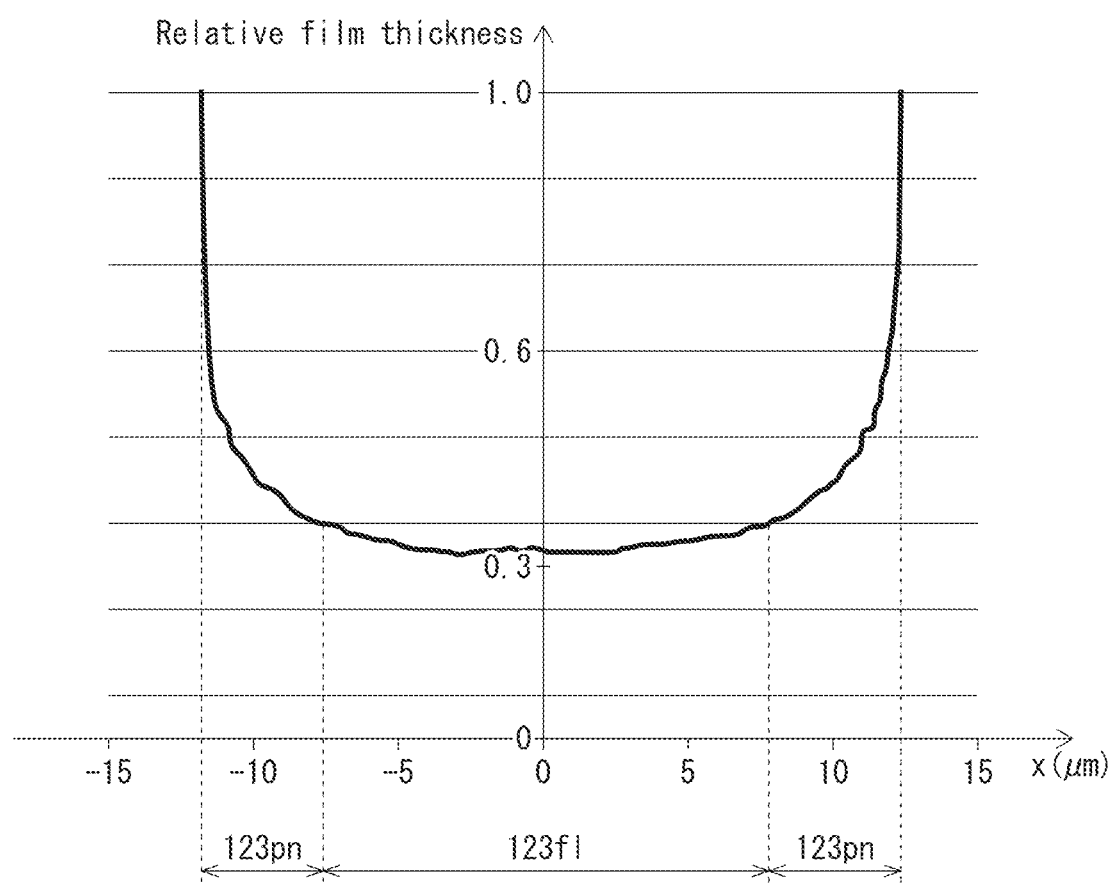
FIG. 15 is a graph of measurement results of film thickness of functional layers up to a light-emitting layer 123 in a cross-section taken along a row direction of the organic EL display panel 10.

FIG. 15 illustrates results of measuring film thicknesses of functional layers up to the light-emitting layer 123 in a cross-section taken along the row direction of the light-emitting element 100B of the display panel 10. As illustrated in FIG. 15, film thickness of the functional layers formed by an application method is in a range from 0.26 to 0.33 within a range of ±7.5 μm from a center (x=0) in the row direction of the gap 122z between banks, or in other words a flat portion 123fl exists in which variation in film thickness is 0.07 or less. On both side of the flat portion 123fl in the x direction, film thickness gradually increases from 0.33 to 0.73 as the distance from the flat portion 123fl increases, or in other words pinning portions 123pn exist with film thicknesses greater than the flat portion 123fl in ranges of 5 μm either side of the flat portion 123fl.

That is, each of the light-emitting layers 123 has a relatively uniform flat portion 123fl in a width range including a center of the gap 122z between the banks in the row direction having a film thickness in a defined range. Further, the light-emitting layers 123 include pinning portions 123pn on both sides of the flat portions 123fl in the row direction that have larger film thicknesses than the flat portions 123fl. In the pinning portions 123pn, film thickness gradually increases towards a maximum film thickness with increasing distance from the flat portion 123fl.

Figure 16:
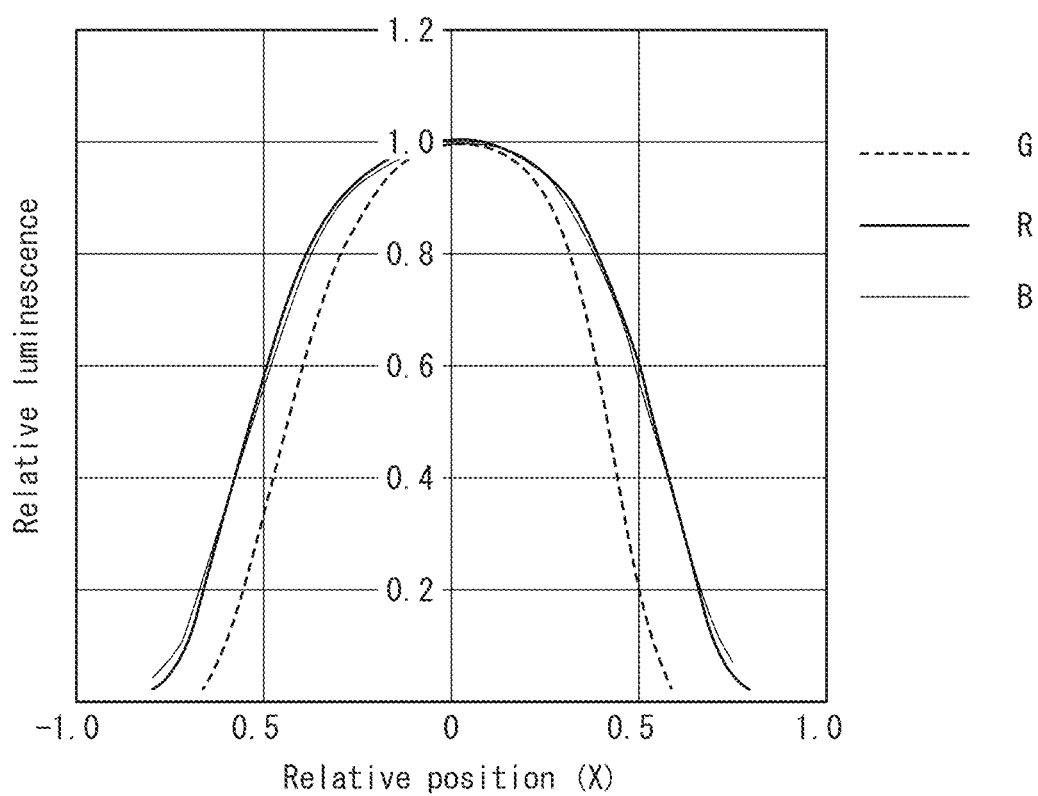
FIG. 16 is a graph of measurement results of chromaticity (y value) distribution measured at positions corresponding to the line A1-A1 in FIG. 1 in sub-pixels of an organic EL display panel.

FIG. 16 is a schematic diagram illustrating results of measurement of luminance (relative luminance) distribution of monochromatic light measured at positions corresponding to A1-A1 in FIG. 1 for each color of sub-pixel of the display panel 10.

As illustrated in FIG. 16, in each color of light-emitting element 100R, 100G, 100B of the display panel 10, a distribution of relative brightness of 0.1 or more was observed in a range corresponding to the flat portion 123fl of the light-emitting layer 123. Light emission luminance distribution shape is different depending on the colors of the light-emitting elements 100R, 100G, 100B, with the light-emitting elements 100G showing a steeper distribution shape than the light-emitting elements 100R, 100G.

Further, the inventor confirmed that when the light-emitting elements 100R, 100G, 100B are viewed from the viewing angle α, the light-emitting elements 100R, 100B have a larger rate of reduction in visually recognized luminance than the light-emitting elements 100G.

In the light-emitting layer 123, the flat portion 123fl having a smaller film thickness that the pinning portions 123pn has a smaller electrical resistance than the pinning portions 123pn, and therefore current density is high and light emission in the flat portion 123fl becomes dominant. Thus, in a range corresponding to the flat portion 123fl of the light-emitting layer 123, a relative luminance distribution of 0.1 or more was observed.

Further, in manufacturing the light-emitting layers 123, as described above, the inks 123RI, 123GI, 123BI that contain materials of R, G, B organic light-emitting layers are applied to the gaps 122z that are sub-pixel formation areas, the inks are dried under low pressure, and baked to form the light-emitting layers 123R, 123G, 123B. In the application of the inks of the light-emitting layers 123, solutions for forming the light-emitting layers 123 are applied using a droplet discharge device, but the inks 123RI, 123GI, 123BI each include different organic light-emitting layer material, have different solute density, ink viscosity, number of applied droplets, and the like, and therefore the film shapes of the light-emitting layers 123 tend to be different from each other. According to at least one embodiment, the width in the x direction of the flat portions 123fl in the light-emitting layers 123G of the light-emitting elements 100G is smaller than the width in the x direction of the flat portions 123fl in the light-emitting layers 123R, 123B of the light-emitting elements 100R, 100B, and therefore the light-emitting elements 100G have a steeper distribution shape than the light-emitting elements 100R, 100B.

Due to the differences in luminance distribution shapes between the light-emitting elements 100R, 100G, 100B, when the light-emitting elements 100R, 100G, 100B are viewed from the direction of the viewing angle α, even if the light-shielding width and the light-shielding ratios are the same, the light-emitting elements 100R, 100B have a larger visible reduction rate of luminance than the light-emitting elements 100G, luminance balance of the light-emitting elements 100R, 100G, 100B when viewed from the viewing angle α changes, and therefore the chromaticity visually recognized changes.

Figure 17:
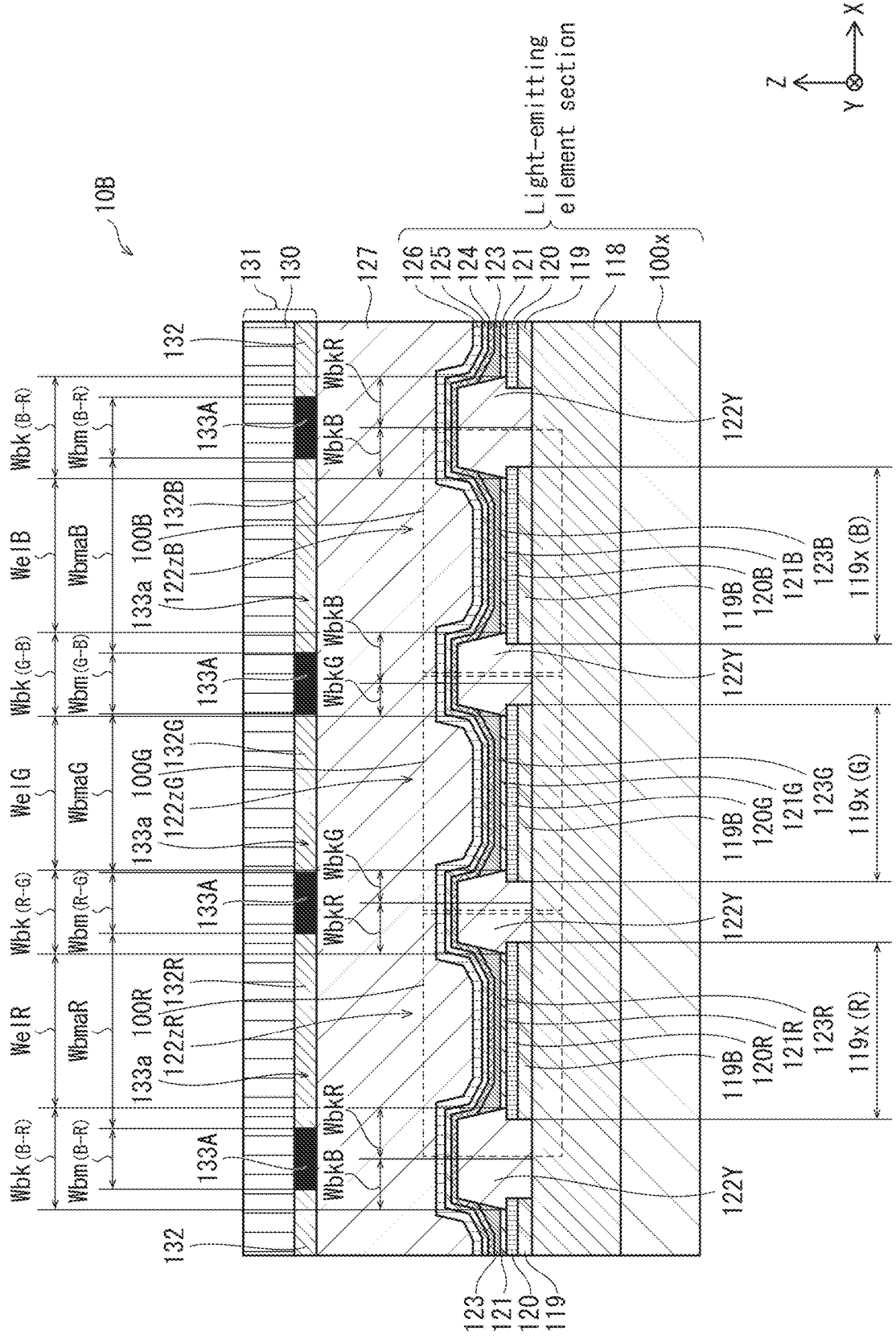
FIG. 17 is a schematic diagram of a cross-section taken from the same location as line A1-A1 in FIG. 1 from an organic EL display panel 10B according to Modification 2.

According to the display panel 10B pertaining to Modification 2, where the light-emitting elements 100G have the steepest light emission distribution, the width WbkG of portions of the column banks 122Y adjacent to the light-emitting elements 100G in the row direction is configured to be smaller than the widths WbkB, WbkR of portions of the column banks 122Y adjacent to the light-emitting elements 100B, 100R in the row direction. FIG. 17 is a schematic diagram of a cross-section taken from the same location as line A1-A1 in FIG. 1 from the display panel 10B according to Modification 2. As illustrated in FIG. 17, according to the display panel 10B, the lengths $119x$ (B), $119x$ (G), $119x$ (R) in the row direction of the pixel electrodes 119 of the light-emitting elements 100B, 100G, 100R are equal, and the widths WelR, WelG, WelB in the row direction of the light-emitting elements 100B, 100G, 100R are also the same as each other. Further, the widths Wbm(R-G), Wbm(G-B), and Wbm(B-R) of portions of the crosspieces in the row direction between the openings $133a$ are equivalent, regardless of the emission color of the light-emitting elements 100. The width WbkG of the portions of the column banks 122Y adjacent to the light-emitting elements 100G in the row direction is larger than the widths WbkB, WbkR of the portions of the column banks 122Y adjacent to the light-emitting elements 100B, 100R in the row direction.

Here, the widths Wbk of the column banks 122Y may be divided at points such that the portion widths are inversely proportional to widths of ½ of the self-luminous areas in each color of the light-emitting elements 100 in the row direction. Alternatively, the widths Wbk of the column banks 122Y may be divided equally.

Accordingly, the light-shielding width for the light-emitting elements 100G is larger than the light-shielding width for the light-emitting elements 100R, 100B, and the light-shielding ratio for the light-emitting elements 100G is larger than the light-shielding ratio for the light-emitting elements 100R, 100B.

Thus, according to the display panel 10B, a change in visually recognized chromaticity when viewed from an oblique direction is reduced, where the change is due to differences in steepness of luminance distribution shapes of the light-emitting elements 100R, 100G, 100B causing differences in visually recognized luminance among the light-emitting elements that have the same apparent light-shielding ratio when viewed from the oblique direction. That is, by changing light-shielding ratios to compensate for differences in luminance reduction rates of the light-emitting elements 100B, 100G, 100R, changes in chromaticity when viewed from an oblique direction can be reduced.

<Effect on Optical Resonator Structure>

Figure 18:
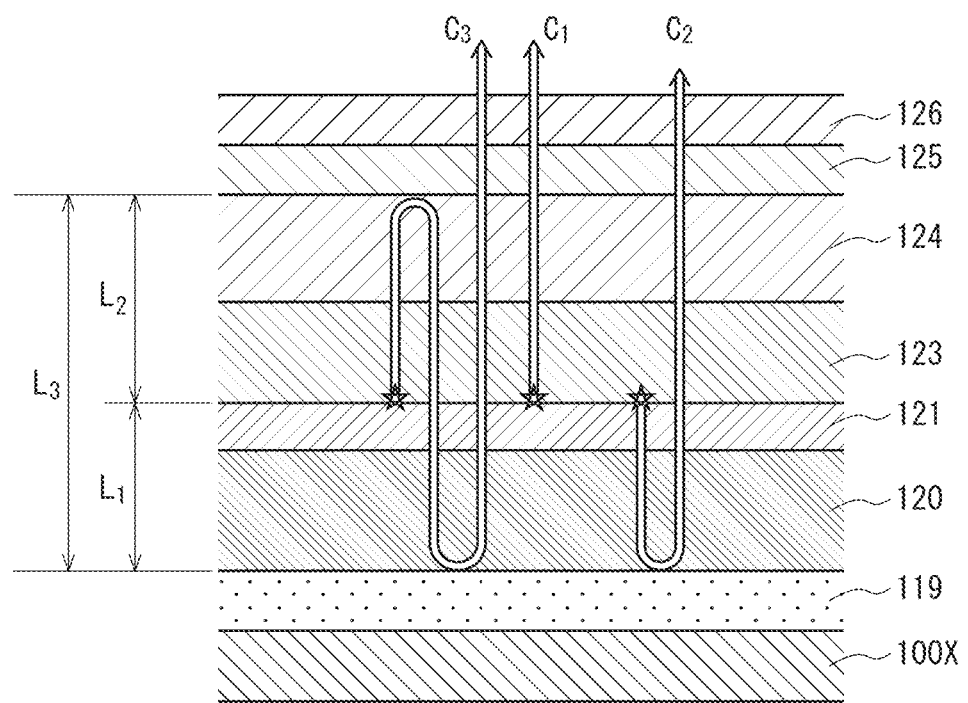
FIG. 18 is a schematic diagram illustrating light interference in an optical resonator structure of the organic EL display panel 10.

According to the display panel 10, an optical resonator structure is adopted to adjust light extraction efficiency. FIG. 18 is a diagram illustrating light interference in an optical resonator structure of the display panel 10 according to at least one embodiment. The drawing illustrates an element section corresponding to one sub-pixel $100se$.

In the optical resonator structure of the sub-pixel $100se$ of the light-emitting element 100, light is emitted from the light-emitting layer 123 from the vicinity of an interface with the hole transport layer 121, and is transmitted through layers. Part of the light is reflected at interfaces between layers, and therefore interference occurs.

Part of the light emitted from the light-emitting layer 123 and traveling towards the counter electrode 125 passes through the counter electrode 125 and is emitted outside the light-emitting element along a first optical path $C_1$, and a part of the light emitted from the light-emitting layer 123 and traveling towards the pixel electrode 119 is reflected at the pixel electrode 119, transmitted through the light-emitting layer 123 and the counter electrode 125, and emitted outside the light-emitting element along a second optical path $C_2$. Thus, there is interference between this directly emitted and reflected light.

An optical film thickness $L_1$ illustrated in FIG. 18 corresponds to a difference in optical distance between the first optical path $C_1$ and the second optical path $C_2$. The optical film thickness L1 is a total optical distance of the hole injection layer 120 and the hole transport layer 121 sandwiched between the light-emitting layer 123 and the pixel electrode 119.

Part of the light traveling from the light-emitting layer 123 towards the counter electrode 125 is reflected at the counter electrode 125, further reflected at the pixel electrode 119, then emitted outside the light-emitting element along a third optical path $C_3$. Thus, interference occurs between light traveling the third optical path $C_3$ and light traveling the first optical path $C_1$. A difference in optical distance between the second optical path $C_2$ and the third optical path $C_3$ corresponds to an optical film thickness $L_2$ illustrated in FIG. 17. The optical film thickness $L_2$ is a total optical distance of the light-emitting layer 123 and the electron transport layer 124.

Thus, interference occurs between light traveling the third optical path $C_3$ and light traveling the first optical path $C_1$. A difference in optical distance between the first optical path $C_1$ and the third optical path $C_3$ corresponds to an optical film thickness $L_3$ illustrated in FIG. 17. The optical film thickness $L_3$ is the sum of the optical film thickness $L_1$ and the optical film thickness $L_2$ ($L_3=L_1+L_2$). The optical film distance $L_3$ is a total optical distance of the hole injection layer 120, the hole transport layer 121, the light-emitting layer 123, and the electron transport layer 124 sandwiched between the pixel electrode 119 and the counter electrode 125.

In the design of optical distance in a light emitting element using an optical resonator structure, film thickness of the light-emitting layer 123 for adjusting both the optical film thickness $L_2$ and the optical film thickness $L_3$ is determined in consideration of film thicknesses of the hole injection layer 120 and the hole transport layer 121, which are determined for adjustment of the optical film thickness $L_1$. In the adjustment of the optical film thicknesses $L_2$, $L_3$ that are affected by the film thickness of the light-emitting layer 123, an optimal optical distance between electrodes is longest for red pixels and shortest for blue pixels, due to differences in light emission wavelengths for each color.

According to investigation by the inventor, an effective optical path length when viewed from an oblique direction gradually decreases as an angle of the viewing direction from the front increases. Therefore, wavelengths of emitted light that cause constructive interference shift towards shorter wavelengths, and when the angle from the front of the viewing direction increases, the wavelengths of emitted light shift towards shorter wavelengths.

In response to this, according to the display panel 10B, the light-emitting elements 100 have different light emission distribution shapes along the row direction according to light emission color, and in the emission distribution shapes, for example, a light-emitting element 100 that has a larger range for a ½ luminance area has a larger distance between an opening edge and an edge of the light-emitting element 100 in the row direction than a light-emitting element 100 that has a smaller range for a ½ luminance area. More specifically, according to Modification 2, for the light-emitting elements 100G, which have the steepest light emission distribution, the width WbkG of the portions of the column banks 122Y adjacent to the light-emitting elements 100G in the row direction is smaller than the widths WbkB, WbkR of the portions of the column banks 122Y adjacent to the light-emitting elements 100B, 100R in the row direction. Accordingly, the light-shielding width for the light-emitting elements 100G is larger than the light-shielding width for the light-emitting elements 100R, 100B, and the light-shielding ratio for the light-emitting elements 100G is larger than the light-shielding ratio for the light-emitting elements 100R, 100B. Thus, light-shielding ratios of each color of the light-emitting elements 100 can be changed to compensate for shifts towards shorter wavelengths of emitted light caused by different pinning portions 123pn when different light-emitting elements 100 are viewed from an oblique direction.

Thus, according to the display panel 10B, emission of light emitted from the flat portion 123fl and the pinning portions 123pn when viewed from an oblique angle can be adjusted by adjusting light-shielding ratios according to light emission colors of light-emitting elements, such that changes in chromaticity of light emitted from each sub-pixel when viewed from the oblique angle can be suppressed.

<Differences in Chromaticity Shifts in Row and Column Directions>

According to the display panel pertaining to at least one embodiment, the light-emitting layers 123 are formed by using an inkjet method, where inks containing constituent materials are applied in the gaps 122z defined by the column banks 122Y, then baked. The light-emitting layers 123 are applied films each having an elongated shape that extends continuously not just in the self-luminous areas 100a, but also in the non-self-luminous areas 100b that are adjacent. Thus, in each of the light-emitting elements 100, the film shape of the light-emitting layer 123 in the row direction includes the pinning portions 123pn on either side of the flat portion 123fl where film thickness gradually increases with distance from the flat portion 123fl. Length of the flat portion 123fl in the column direction is larger than length of the flat portion 123fl in the row direction. Further, in the display panel 10, the unit pixels 100e each composed of three light-emitting elements 100 arranged in the row direction are arranged in a matrix, and therefore row and column direction lengths of each of the sub-pixels 100se corresponding to the light-emitting elements 100 are such that the column direction length is larger than the row direction length. Thus, light-shielding ratios when viewed from an oblique viewing angle are such that the light-shielding ratio in the row direction is greater than the light-shielding ratio in the column direction, and a chromaticity change visually recognized from the oblique viewing angle also changes more in the row direction than in the column direction. Accordingly, regarding edges in the row direction of the opening 133a of the light-shielding film 133, according to at least one embodiment, a light-emitting panel structure is implemented that can effectively reduce chromaticity changes visually recognized from an oblique viewing angle through the adoption of a structure in which the widths Wbk of portions of the column banks 122Y in the row direction are different according to light-emission colors of adjacent light-emitting elements 100 At edges in the column direction of the openings 133a of the light-shielding film 133, even if intervals between the row banks 122X are equal, changes in chromaticity visually recognized from an oblique viewing angle do not usually become a problem.

That is, according to at least one embodiment, the widths Wbma in the row direction and the column direction of the openings 133a of the light-shielding film 133 corresponding to the light-emitting elements 100R, 100G, 100B lead to differences in the row direction and the column direction of visually recognized luminance when viewed from a viewing angle α (α may equal 45°) caused by portions of light emitted from the light-emitting elements 100 being blocked by the light-shielding film 133.

According to at least one embodiment, the widths Wbma in the row direction and the column direction of the openings 133a corresponding to the light-emitting elements 100R, 100G, 100B are structured such that a chromaticity difference (Δu'v') between observed chromaticity (u'v') viewed from the viewing angle α (where α is 45°) in the row direction and the column direction is 0.020 or less.

More specifically, a structure is adopted such that a difference between chromaticity observed from a viewing angle of 45° in the row direction and chromaticity observed from a viewing angle of 45° in the column direction, caused by portions of light from the light-emitting elements 100 being shielded by edges of the openings 133a of the light-shielding film 133, is from 0 to 0.020.

With such a structure, it is possible to reduce a change in chromaticity visually recognized from an oblique viewing angle when opening widths Wbma in the row direction and the column direction of each of the openings 133a of the light-shielding film 133 are decreased, causing light-shielding ratios to increase.

According to at least one embodiment, the change in chromaticity (Δu'v') is 0.004 or less. Thus, the change in chromaticity (Δu'v') is equal to or below a human recognition limit.

According to at least one embodiment, when luminance observed from the viewing angle of 45° in the column direction is 103% or more of luminance observed from a viewing angle of 45° in the row direction, where a difference in observed luminance is caused by a portion of light emitted from each of the light-emitting elements 100 being shielded by the edge of the openings 133a of the light-shielding film 133, then according to the present disclosure, for example, it effective to make distances between the edges of the openings of the light-shielding film in the row direction different by changing widths of portions of the column banks adjacent to the light-emitting elements in the row direction. That is, by making the optical distances between the light emission reference point of the light-emitting elements 100 and the light-shielding film 133 corresponding to the light-emitting elements 100 different according to light-shielding ratios for each of the light-emitting elements 100, luminance balance from the light-emitting elements 100 can be controlled such that optimum points of chromaticity (u'v') observed from the viewing angle α (where α is) 45°) in the row direction and the column direction can be made to match. Thus, where the light-emitting layers 123 of the light-emitting elements 100 are applied films each having an elongated shape that is continuous in one of the gaps 122z between the column banks 122Y, it is possible to implement a display panel structure that even more accurately compensates for changes in chromaticity visually recognized from an oblique viewing angle due to changes in light-shielding ratios of the light-emitting elements 100B, 100G, 100R.

<Other Modifications>

According to the display panels 10, 10A pertaining to embodiments described above, the pixel electrodes 119 arranged in a matrix correspond to self-luminous areas 100aR, 100aG, 100aB, arranged in groups of three along the row direction. Lengths 119x in the row direction of the pixel electrodes 119 are configured such that the lengths 119x of the pixel electrodes 119 corresponding to the light-emitting elements 100 go from largest to smallest in the order of the light-emitting elements 100B, 100G, 100R. In plan view, areas of the self-luminous areas 100aB, 100aG, 100aR have a similar relationship of relative sizes. However, according to at least one embodiment, the lengths 119x in the row direction of the pixel electrodes 119, and lengths in the row direction and areas of the light-emitting elements 100B, 100G, 100R (self-luminous areas 100aB, 100aG, 100aR) are not limited to the examples described above. For example, according to Modification B, the lengths 119x in the row direction of the pixel electrodes 119 are the same for the light-emitting elements 100B, 100G, 100R. According to at least one embodiment, the lengths 119x in the row direction of the pixel electrodes 119 go from largest to smallest in the order of the light-emitting elements 100R, 100G, 100B. According to at least one embodiment, any alternative size relationship of the lengths 119x may be used.

According to the light-emitting elements 100 pertaining to at least one embodiment, the hole injection layers 120, the hole transport layers 121, the light-emitting layer 123, and the electron transport layer 124 are present between the pixel electrodes 119 and the electron transport layer 124, but the present disclosure is not limited to this structure. According to at least one embodiment, a structure may omit one or more of the hole injection layers 120, the hole transport layers 121, and the electron transport layer 124, such that, for example, between the pixel electrodes 119 and the counter electrode 125, the hole transport layers 121 and the light-emitting layers 123 are present, or the light-emitting layers 123 and the electron transport layer 124 are present, or the hole transport layers 121, the light-emitting layers 123, and the electron transport layer 124 are present. Further, for example, aside from the light-emitting layers 123, a structure may include a layer or a plurality of layers selected from the group consisting of hole injection layers, hole transport layers, electron transport layer, and electron injection layer. Further, all these layers need not be made of organic compounds, and one or more layers may be made of an inorganic compound.

According to the display panel 10 pertaining to at least one embodiment, the banks 122 have a line-shaped bank structure. Between each two adjacent pixel electrodes 119 in the row direction is one of the column banks 122Y that extends in the column direction (Y direction in FIG. 1). Between each two adjacent pixel electrodes 119 in the column direction is one of the row banks 122X that extends in the row direction (X direction in FIG. 1). The light-emitting layers 123 are continuous across areas where the row banks 122X are present, but organic luminescence does not occur in these areas, which are therefore non-self-luminous areas 100b. However, according to at least one embodiment, the light-emitting layers 123 are not formed in areas where the row banks 122X are present, the light-emitting layers 123 have island shapes within a lattice formed by the row banks 122X and the column banks 122Y, and therefore each sub-pixel is separated. Even in a structure where the light-emitting layers 123 are partitioned by pixel banks, chromaticity changes occur in the pinning portions 123pn of the light-emitting layers 123. In such a structure, according to the display panel 10, emission of light emitted from the flat portion 123fl and the pinning portions 123pn when viewed from an oblique angle can be adjusted by adjusting light-shielding ratios according to light emission colors of light-emitting elements, such that changes in chromaticity of light emitted from each sub-pixel when viewed from the oblique angle can be suppressed.

According to at least one embodiment, colors of light emitted by the light-emitting layers 123 of the sub-pixels 100se adjacent in the row direction in the gaps 122z between the column banks 122Y are different from each other, while light emitted by the light-emitting layers 123 of the sub-pixels 100se adjacent in the column direction in gaps between the row banks 122X is the same color. However, the light emitted by the light emitting layers 123 of the sub-pixels 100se that are adjacent in the row direction may be the same color, and the colors of light emitted by the light emitting layers 123 of the sub-pixels 100se that are adjacent in the column direction may be different from each other.

According to the display panel 10 pertaining to at least one embodiment, each of the pixels 100e includes a red sub-pixel, a green sub-pixel, and a blue sub-pixel, but the present disclosure is not limited to this. As another example, the light emitting layers may all be of a single type, or there may be four types emitting colors of light such as red, green, blue, and white.

Further, according to at least one embodiment, the pixels 100e are arranged in a matrix, but the present disclosure is not limited to this. For example, when an interval between pixel areas is one pitch, adjacent pixel regions in the row direction may be shifted by a half pitch in the column direction. In a high-definition display panel, a slight shift in the column direction is difficult to visually recognize, and even if film thickness irregularity occurs along a straight line (or staggered pattern) of a certain width, it will be visually recognized as a band. Thus, even in such a case, display quality of a display panel can be improved by suppressing uneven luminance when arranged in a staggered pattern.

According to at least one embodiment, the pixel electrodes 119, which are anodes, are disposed below the EL element sections and connected to the wiring 110 connected to source electrodes of TFTs, but a structure may be adopted in which a counter electrode is disposed below the EL element sections and an anode is disposed above. In such a case, drains of the TFTs connect the cathode below the EL element sections.

Further, according to at least one embodiment, a structure is adopted in which two transistors $Tr_1$, $Tr_2$ are provided for each of the sub-pixels 100se, but the present disclosure is not limited to this. For example, a structure may be adopted in which a single transistor or three or more transistors correspond to one sub-pixel. Further, according to at least one embodiment, a top-emission type of EL display panel is given as an example, but the present disclosure is not limited to this. For example, a bottom-emission type of display panel or the like can be used. In such a case, each structure can be changed appropriately.

At least one embodiment describes the method for manufacturing the organic EL display panel that uses organic electroluminescence for a light-emitting layer, but the present disclosure is also applicable to an inorganic EL display panel that uses inorganic electroluminescence for a light-emitting layer, a quantum dot display panel that uses quantum dot light-emitting diodes (LEDs) as a light-emitting layer (for example, see JP 2010-199067), or the like, where only structure and type of light-emitting layer are different, but structure such as the light-emitting layers and other functional layers being between pixel electrodes and a counter electrode is the same as that of an organic EL display panel, and where the light-emitting layers or another functional layer are formed by an application method.

Supplement>>

The embodiments described above each indicate one beneficial specific example of the present invention. Numerical values, shapes, materials, constituent elements, arrangement positions and connections of constituent elements, steps, order of steps, and the like indicated as embodiments are merely examples and are not intended to limit the present invention. Further, among constituent elements in the embodiments, any elements not described in independent claims representing top level concepts of the present invention are described as constituent elements constituting a more beneficial embodiment.

Further, the order described above in which steps are executed is for illustrative purposes, and the steps may be in an order other than described above. Further, a portion of the steps described above may be executed simultaneously (in parallel) with another step.

Further, in order to facilitate understanding of the invention, constituent elements in each drawing referenced by description of an embodiment are not necessarily drawn to scale. Further, the present invention is not limited to the description of the embodiments, and can be appropriately changed without departing from the scope of the present invention.

Further, at least a portion of functions of each embodiment and each modification may be combined.

Further, the present disclosure includes various modifications of the embodiments that are within the scope of ideas conceivable by a person skilled in the art.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

The invention claimed is:

1. A self-luminous display panel in which pixels composed of sub-pixels are arranged in a matrix of rows and columns, comprising:
   light-emitting elements corresponding one-to-one with the sub-pixels, each sub-pixel in a pixel emitting a different color of light;
   column banks disposed between the light-emitting elements in a row direction, each of the column banks having an elongated shape in a column direction; and
   a light-shielding film provided with openings at positions corresponding to the light-emitting elements in plan view, downstream in a light emission direction of the light-emitting elements, wherein
   in plan view, distances in the row direction between edges of the openings of the light-shielding film and defined points of the light-emitting elements are different depending on light emission color of the light-emitting elements, due to different widths of portions of the column banks adjacent to the light-emitting elements,
   the light-emitting elements have different widths in the row direction depending on the the light emission color of the light-emitting element, and
   among the light-emitting elements of each pixel, a first light-emitting element that has a larger width has smaller values for the distances in the row direction between the edges of the corresponding opening and the defined points of the light-emitting element than a second light-emitting element that has a smaller width.

2. The self-luminous display panel of claim 1, wherein
   among crosspieces of the light-shielding film between the openings, among the crosspieces corresponding to each pixel, a first crosspiece that has a smaller width in the row direction corresponds to a column bank that has a larger width in the row direction while a second crosspiece that has a larger width in the row direction corresponds to a column bank that has a smaller width in the row direction.

3. The self-luminous display panel of claim 1, wherein
   widths in the row direction of crosspieces of the light-shielding film between the openings are constant, regardless of light emission color of the light-emitting elements.

4. The self-luminous display panel of claim 1, wherein
   the light-emitting elements of each pixel are arranged in a line in the row direction,
   each of the light-emitting elements includes a light-emitting layer including an applied film disposed in a gap between the column banks, and
   each of the light-emitting layers includes a flat portion that has a substantially uniform film thickness disposed in a range that includes a center point in the row direction of the gap between the column banks, and pinning portions disposed on either side of the flat portion in the row direction that have a larger film thickness than the flat portion.

5. The self-luminous display panel of claim 4, wherein
   a difference in chromaticity between chromaticity observed from a viewing angle of 45° from the front of the display panel in the row direction and chromaticity observed from a viewing angle of 45° from the front of the display panel in the column direction is from 0 to 0.020, where the difference in observed chromaticity is caused by a portion of light emitted from each light-emitting element being shielded by the edge of the opening of the light-shielding film.

6. The self-luminous display panel of claim 4, wherein
   luminance observed from a viewing angle of 45° from the front of the display panel in the column direction is 103% or more of luminance observed from a viewing angle of 45° from the front of the display panel in the row direction, where a difference in observed luminance is caused by a portion of light emitted from each light-emitting element being shielded by the edge of the opening of the light-shielding film.

7. A self-luminous display panel in which pixels composed of sub-pixels are arranged in a matrix of rows and columns, comprising:
- light-emitting elements corresponding one-to-one with the sub-pixels, each sub-pixel in a pixel emitting a different color of light;
- column banks disposed between the light-emitting elements in a row direction, each of the column banks having an elongated shape in a column direction; and
- a light-shielding film provided with openings at positions corresponding to the light-emitting elements in plan view, downstream in a light emission direction of the light-emitting elements, wherein
- in plan view, distances in the row direction between edges of the openings of the light-shielding film and defined points of the light-emitting elements are different depending on light emission color of the light-emitting elements, due to different widths of portions of the column banks adjacent to the light-emitting elements, and
- among crosspieces of the light-shielding film between the openings, among the crosspieces corresponding to each pixel, a first crosspiece that has a smaller width in the row direction corresponds to a column bank that has a larger width in the row direction while a second crosspiece that has a larger width in the row direction corresponds to a column bank that has a smaller width in the row direction.

8. A self-luminous display panel in which pixels composed of sub-pixels are arranged in a matrix of rows and columns, comprising:
- light-emitting elements corresponding one-to-one with the sub-pixels, each sub-pixel in a pixel emitting a different color of light;
- column banks disposed between the light-emitting elements in a row direction, each of the column banks having an elongated shape in a column direction; and
- a light-shielding film provided with openings at positions corresponding to the light-emitting elements in plan view, downstream in a light emission direction of the light-emitting elements, wherein
- in plan view, distances in the row direction between edges of the openings of the light-shielding film and defined points of the light-emitting elements are different depending on light emission color of the light-emitting elements, due to different widths of portions of the column banks adjacent to the light-emitting elements, and
- widths in the row direction of crosspieces of the light-shielding film between the openings are constant, regardless of light emission color of the light-emitting elements.

* * * * *